US009754673B2

(12) United States Patent
Park et al.

(10) Patent No.: US 9,754,673 B2
(45) Date of Patent: Sep. 5, 2017

(54) METHOD OF INITIALIZING AND DRIVING 3D NON-VOLATILE MEMORY DEVICE USING TIME VARYING ERASE SIGNAL

(71) Applicants: SK hynix Inc., Icheon (KR); Seoul National University R&DB Foundation, Seoul (KR)

(72) Inventors: Byung Gook Park, Seoul (KR); Dae Woong Kwon, Seoul (KR); Do Bin Kim, Seoul (KR); Sang Ho Lee, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/342,039

(22) Filed: Nov. 2, 2016

(65) Prior Publication Data

US 2017/0125109 A1  May 4, 2017

(30) Foreign Application Priority Data

Nov. 3, 2015 (KR) ........................ 10-2015-0154161

(51) Int. Cl.
| | |
|---|---|
| G11C 16/04 | (2006.01) |
| G11C 16/20 | (2006.01) |
| G11C 16/14 | (2006.01) |
| G11C 16/32 | (2006.01) |
| H01L 27/11556 | (2017.01) |
| H01L 27/11582 | (2017.01) |
| G11C 16/10 | (2006.01) |
| G11C 16/12 | (2006.01) |

(52) U.S. Cl.
CPC .......... *G11C 16/20* (2013.01); *G11C 16/0483* (2013.01); *G11C 16/10* (2013.01); *G11C 16/14* (2013.01); *G11C 16/32* (2013.01); *H01L 27/11556* (2013.01); *H01L 27/11582* (2013.01); *G11C 16/12* (2013.01)

(58) Field of Classification Search
CPC ..... G11C 16/20; G11C 16/0483; G11C 16/32; G11C 16/12; G11C 16/14; G11C 16/10; H01L 27/11556; H01L 27/11582
USPC ..................................... 365/185.19
See application file for complete search history.

(56) References Cited

U.S. PATENT DOCUMENTS

| | | | | |
|---|---|---|---|---|
| 2008/0316820 | A1* | 12/2008 | Seol ................. | G11C 11/5628 365/185.03 |
| 2013/0250677 | A1* | 9/2013 | Nam .................. | G11C 13/0002 365/185.03 |

FOREIGN PATENT DOCUMENTS

| | | |
|---|---|---|
| KR | 10-2011-0111166 A | 10/2011 |
| KR | 10-2013-0097592 A | 9/2013 |

\* cited by examiner

*Primary Examiner* — Tha-O H Bui

(57) ABSTRACT

A method of controlling a 3D non-volatile memory device includes initially leveling threshold voltages of the string selection transistors disposed in one or more of the plurality of memory layers to have a predetermined target level; applying a first time varying erase voltage signal having a first time varying section to a first plurality of channel lines of a first memory layer selected among the plurality of memory layers comprising the initially leveled string selection transistors; and setting threshold voltages of the initially leveled string selection transistors in the first memory layer by controlling each of the plurality of string selection lines respectively coupled with the initially leveled string selection transistors during the first time varying section of the first time varying erase voltage signal.

20 Claims, 11 Drawing Sheets

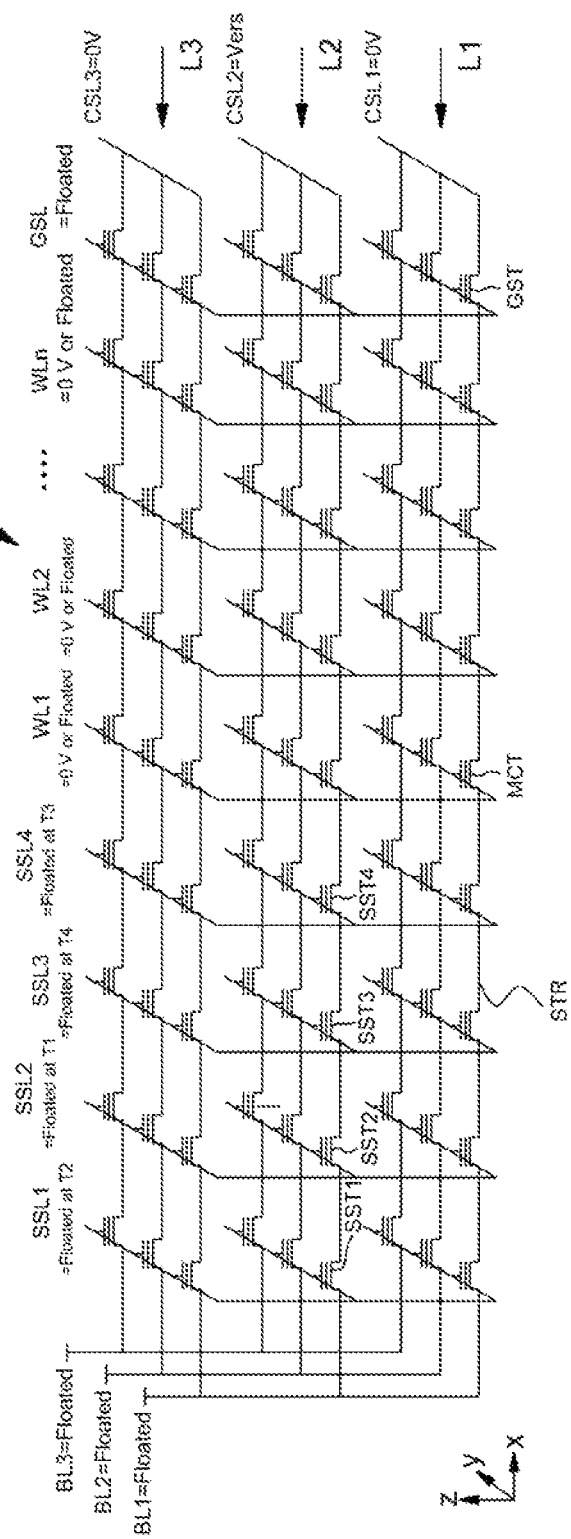

METHOD OF INITIALIZING AND DRIVING 3D NON-VOLATILE MEMORY DEVICE USING TIME VARYING ERASE SIGNAL

CROSS-REFERENCE TO RELATED APPLICATION

This application claims the benefit of Korean Patent Application No. 10-2015-0154161, filed on Nov. 3, 2015, in the Korean Intellectual Property Office, the disclosure of which is incorporated herein in its entirety by reference.

BACKGROUND

1. Field

Embodiments of the present disclosure relate to a semiconductor technique, and more particularly, to a method of initializing and programming a three-dimensional (3D) non-volatile memory device.

2. Description of the Related Art

Due to increased demands for portable application devices, such as digital cameras, smart phones, and tablet PCs, and replacement of conventional hard disk drives with solid-state drives (SSDs), markets for non-volatile memory devices are rapidly growing. Among these non-volatile memory devices, NAND flash memory devices are popular due to low manufacturing cost for a high degree of integration.

Recently, downscaling the NAND flash memory device with a conventional two-dimensional (2D) memory cell array architecture has become more difficult as 20 nm or smaller photolithography techniques have reached their limits. In addition, design issues, which are related to reduction of a sensing margin in accordance with reduction of a number of electrons stored in a data storage element (e.g., a floating gate), and related to disturbances between memory cells, have become barriers against the downscaling.

To address the issues for downscaling the NAND flash memory devices, various 3D NAND flash array structures have been suggested. For example, the Korean Patent Laid-Open Gazette No. 10-2011-011166 discloses a "Layer selection by erase operation (LASER)" structure having a channel-stacked array architecture, the entire disclosure thereof is incorporated herein in its entirety by reference. Unlike conventional 2D flat-panel type memory arrays, the 3D LASER structure requires a memory layer selection with respect to stacked memory layers for a read operation, a write operation, or an erase operation, where the memory layer selection may be performed based on various combinations of string selection transistors. As another example for the 3D NAND flash memory devices, a 3D NAND flash memory device having memory layer selecting mechanism based on "layer selection by multi-level operation (LSM)" using multi-level string selection transistors has been suggested.

To select a memory layer in various 3D NAND flash memory devices, such as based on the LASER structure and the LSM structure, it is desirable to program or initialize string selection transistors to cause them to have certain threshold values. It is preferable that a program operation on the string selection transistors be performed within a predetermined short timing sequence, and without causing disturbances between memory layers.

SUMMARY

Embodiments of the present disclosure include a method of initializing a three-dimensional (3D) non-volatile memory device, the 3D non-volatile memory device comprising a plurality of string selection lines, a plurality of wordlines, a ground selection line, and a plurality of memory layers, each of the memory layers comprising a plurality of channel lines respectively coupled to a plurality of bitlines via first ends of the plurality of channel lines and coupled to a common source line via second ends of the plurality of channel lines, wherein the plurality of string selection lines, the plurality of wordlines, and the ground selection line intersect with the plurality of channel lines, and each of the plurality of channel lines defines a memory string and the memory string has string selection transistors respectively coupled with the plurality of string selection lines.

Embodiments of the present disclosure also include a method of reliably programming a 3D non-volatile memory device for programming selected memory cells without disturbances between the selected memory cell and unselected memory cells by using initialized string selection transistors.

In accordance with an aspect of the present disclosure, there is provided a method of initializing a 3D non-volatile memory device, which includes a plurality of string selection lines, a plurality of wordlines, a ground selection line, and a plurality of memory layers, each of the memory layers comprising a plurality of channel lines respectively coupled to a plurality of bitlines via first ends of the plurality of channel lines and coupled to a common source line via second ends of the plurality of channel lines, wherein the plurality of string selection lines, the plurality of wordlines, and the ground selection line intersect with the plurality of channel lines, and each of the plurality of channel lines defines a memory string and the memory string has string selection transistors respectively coupled with the plurality of string selection lines.

According to the present disclosure, the method may include initially leveling threshold voltages of the string selection transistors disposed in one or more of the plurality of memory layers to have a predetermined target level; applying a first time varying erase voltage signal having a first time varying section to a first plurality of channel lines of a first memory layer selected among the plurality of memory layers comprising the initially leveled string selection transistors; and setting threshold voltages of the initially leveled string selection transistors in the first memory layer by controlling each of the plurality of string selection lines respectively coupled with the initially leveled string selection transistors during the first time varying section of the first time varying erase voltage signal.

In accordance with an embodiment, the method may further include selecting a second memory layer among the plurality of memory layers comprising the initially leveled string selection transistors, and applying a second time varying erase voltage signal having a second time varying section to a second plurality of channel lines of the second selected memory layer; and setting respective threshold voltages of a second plurality of string selection transistors in the second memory layer by controlling the plurality of string selection lines respectively coupled with corresponding ones of the second plurality of string selection transistors during a second time interval corresponding to the second time varying section of the second time varying erase voltage signal.

In accordance with an embodiment, the predetermined target level may include a plurality of target levels respectively corresponding to the plurality of memory layers, the plurality of target levels being different from one another.

The first time varying section of the first time varying erase voltage signal may be a single time varying section.

The first time varying section of the first time varying erase voltage signal may include a ramping section, a step-like section, or a combination thereof. Furthermore, the first time varying section may include an increasing ramp section or a decreasing ramp section.

In accordance with an embodiment, the first time varying erase voltage signal may be applied to a first common source line coupled to the selected first memory layer. In this case, the method may further include applying a voltage signal for erase inhibition to one or more of common source lines other than the first common source line, the one or more common source lines being coupled to one or more of unselected memory layers among the plurality of memory layers when the first time varying erase voltage signal is applied and the threshold values of the first plurality of string selection transistors in the first memory layer are set. In one embodiment, the voltage signal for erase inhibition has a positive voltage level that is smaller than a maximum level of the first time varying erase voltage signal.

In an embodiment, the method may further include causing the plurality of bitlines to float when the first time varying erase voltage signal is applied and the threshold values of the first plurality of string selection transistors in the first memory layer are set. In addition, the method may further include comprising causing the plurality of wordlines to float when the first time varying erase voltage signal is applied and the threshold values of the first plurality of string selection transistors in the first memory layer are set.

In an embodiment, when the first time varying section of the first time varying erase voltage signal has an increasing ramp section, controlling each of the plurality of string selection lines may include causing each of the string selection lines that were in a ground state to float at a plurality of time points within the first time interval corresponding to the first time varying section to terminate erase operations for the first plurality of string selection transistors at the plurality of time points, respectively. In other embodiment, when the first time varying section of the time varying erase voltage signal has a decreasing ramp section, controlling each of the plurality of string selection lines may include grounding each of the plurality of string selection lines that were in a floated state at a plurality of time points within the first time interval corresponding to the first time varying section to start erase operations for the first plurality of string selection transistors at the plurality of time points, respectively.

The channel lines of the 3D non-volatile memory device may have a channel stacked structure, a straight-shaped bit cost scalable (BiCs) structure, a pipe-shaped BiCs structure, or a combination thereof. Furthermore, the 3D non-volatile memory device may be a NAND flash memory device.

In accordance with another aspect of the present disclosure, there is provided a method of programming a 3D non-volatile memory device. The method may include selecting a memory layer among the plurality of memory layers; and, programming a selected memory cell of a selected memory string among a plurality of memory strings of the selected memory layer by applying a bitline program voltage to a bitline coupled to the selected memory string, applying a program inhibition voltage higher than the bitline program voltage to bitlines coupled to unselected memory strings, and applying a program voltage to a wordline coupled to the selected memory cell.

In accordance with an embodiment, the bitline program voltage may be a ground voltage. Furthermore, the program inhibition voltage may be a common collector voltage. A common collector voltage may be applied to common source lines of unselected memory layer among the plurality of memory layers.

The plurality of channel lines of the 3D non-volatile memory device may have a channel stacked structure, a straight-shaped bit cost scalable (BiCs) structure, a pipe-shaped BiCs structure, or a combination thereof. Furthermore, the 3D non-volatile memory device may be a NAND flash memory device.

BRIEF DESCRIPTION OF THE DRAWINGS

Hereinafter, embodiments of the present disclosure will be described in greater detail with reference to the accompanying drawings.

FIGS. 3A to 3C are circuit diagrams illustrating a process for initializing string selection transistors of a 3D non-volatile memory device, in accordance with an embodiment of the present disclosure.

DETAILED DESCRIPTION

Figure 1:
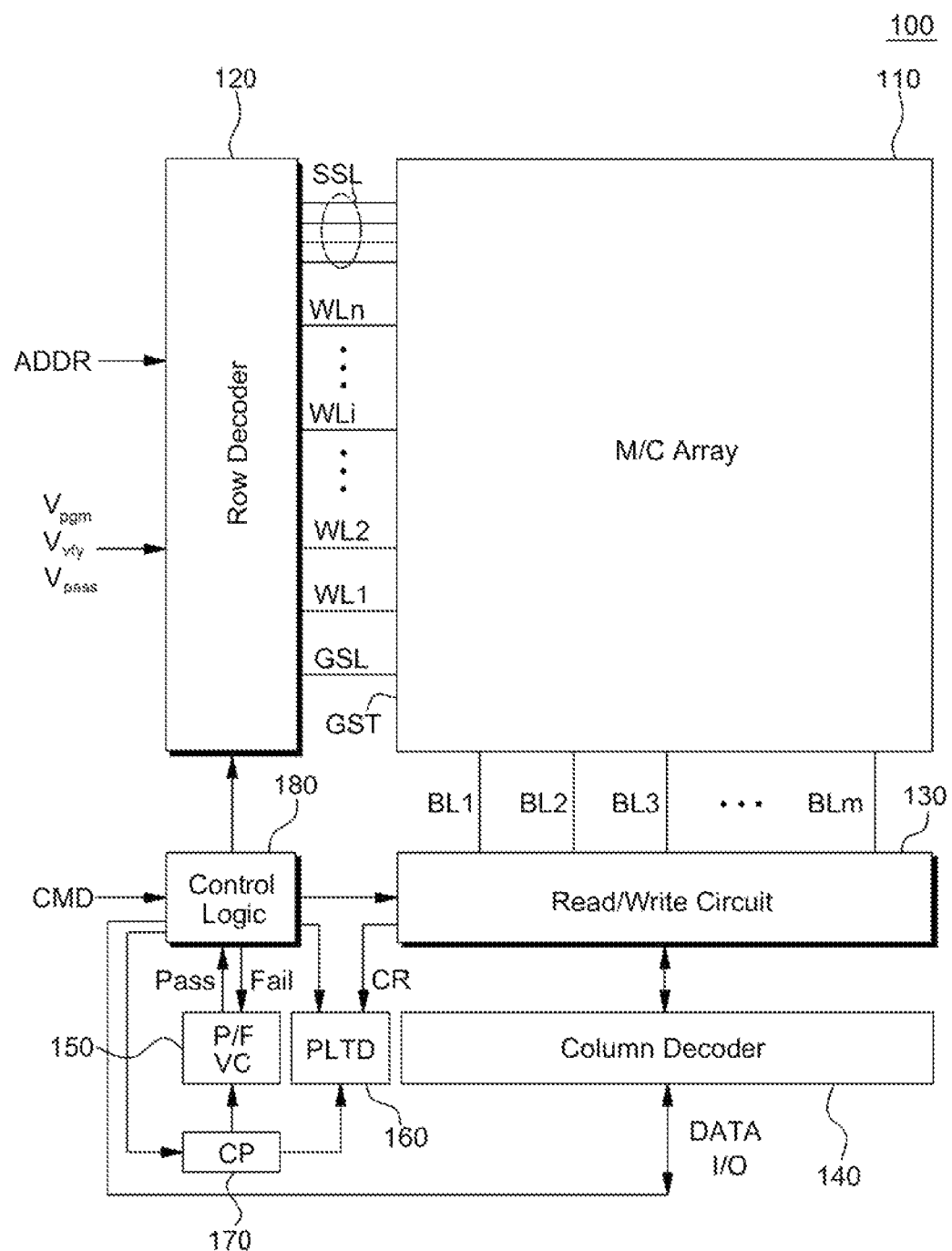
FIG. 1 is a block diagram showing a 3D non-volatile memory device in accordance with an embodiment of the present disclosure.

Embodiments of the present disclosure will now be described more fully with reference to the accompanying drawings, in which illustrative embodiments are shown. Embodiments of the present disclosure may, however, be implemented in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a shape "adjacent to" another shape may overlap with the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

FIG. 1 is a block diagram showing a 3D non-volatile memory device 100 in accordance with an embodiment.

Referring to FIG. 1, the 3D non-volatile memory device 100 may include a memory cell array 110 having a plurality of memory cells, a row decoder 120, a read/write circuit 130, and a column decoder 140. The memory cell array 110 may be connected to the row decoder 120 via wordlines WL1 to WLn, selection lines SSL, and a ground line GSL. Furthermore, the memory cell array 110 may be connected to the read/write circuit 130 via bitlines BL1 to BLm.

If the 3D non-volatile memory device 100 is a NAND flash memory device, the memory cell array 110 may include memory strings (not shown) in which a plurality of memory cells are electrically connected in series. At least two or more string selection transistors are connected to first ends of the memory strings, whereas ground select transistors may be connected to second ends of the memory strings. A common source line may be connected to the second ends of the memory strings via the ground select transistors. The word lines WL1 to WLn may be connected to control gates of memory cells arranged in a column-wise direction, respectively. The bitlines BL1 to BLm may be connected to the first ends of the memory strings via the string selection transistors.

A plurality of memory cells having control gate electrodes coupled with the respective wordlines WL1 to WLn, in a row-wise direction may constitute a logical page, where a number of logical pages may be determined by a storage capacity of the memory cells. For example, in accordance with a level of the storage capacity, one or more of a single level cell (SLC) memory device, in which each memory cell stores 1 bit, a multi level cell (MLC) memory device, in which each memory cell stores 2 bits, an eight level cell (8LC) memory device, in which each memory cell stores 3 bits, and a sixteen level cell (16LC) memory device, in which each memory cell stores 4 bits, may be provided.

Memory cells of the memory cell array 110 may be arranged in a 2D array structure that is disposed substantially parallel to a main surface of a semiconductor substrate, or a 3D array structure having a channel perpendicular to a main surface of a semiconductor substrate or one or more memory array layers stacked in a vertical direction of the main surface of the semiconductor substrate. For example, the 3D array structure in accordance with an embodiment of the present disclosure may be a channel stacked structure, a straight-shaped bit cost scalable (BiCs) structure, or a pipe-shaped BiCs structure, where various memory layer selecting methods described below may be applied to the structures. However, the above-described structures are merely examples, and embodiments of the present disclosure are not limited thereto.

The memory cells constituting a page may be programmed in a same program cycle. For example, memory cells connected to a wordline WL1 may be programmed to have an identical program state (or have a target value) in the same program cycle. Alternatively, the memory cells connected to the wordline WL1 may be programmed to have different program states, for example, in a single program cycle, a first memory cell may be programmed to have a first program state P1, a second memory cell adjacent to the first memory cell may be programmed to have a second program state P2, and other memory cells may be programmed to have a third program state P3. However, embodiments of the present disclosure are not limited thereto. In accordance with another embodiment, an SLC device has an interleaved architecture, and even-numbered cells and odd-numbered cells may constitute two pages respectively. For example, a 4 kb SLC device may include wordlines for 65,536 memory cells. Furthermore, in case of an MLC device, since each cell stores one least significant bit (LSB) and one most significant bit (MSB), the MLC device has four pages. For example, in the MLC device, MSB pages and LSB pages on even-numbered bitlines and MSB pages and LSB pages on odd-numbered bitlines may be provided.

The row decoder 120 may select a plurality of string selection lines SSL or may drive corresponding memory cells by applying a voltage or a current thereto. Furthermore, the row decoder 120 may select any one of wordlines in a memory block. The row decoder 120 may apply a selection line voltage from a voltage generator (not shown) to the selected wordline of the selected memory block. During a program operation, the row decoder 120 may apply a program voltage $V_{pgm}$ and a verify voltage $V_{vfy}$ to the selected wordline, and apply a pass voltage $V_{pass}$ to unselected word lines.

The memory cell array 110 may be addressed by the bitlines BL1 to BLm via the column decoder 140. The read/write circuit 130 may receive data from an external circuit via the column decoder 140, or may transmit data to the external circuit via the column decoder 140.

The read/write circuit 130 may include a page buffer (not shown) and may operate as a sense amplifier or a write driver in accordance with operation modes. However, in the present disclosure, the words, "read/write circuit" and "page buffer" may be used as equivalent terms and shall be understood as interchangeable terms. During a program operation, the read/write circuit 130 receives data from an external circuit and transmits a bitline voltage corresponding to the received data to a selected bitline of the cell array 110. During a read operation, the read/write circuit 130 may read out data stored in a selected memory cell via a selected bitline, latch the read out data, and output the latched data to the external circuit.

The read/write circuit 130 may perform a verification operation associated with a program operation on a selected memory cell in response to a transmission signal received from a control circuit (or a control logic) 180 and, in response to the transmission signal, may output a result of the verification operation as page buffer signals over a plurality of number of times. In accordance with an embodiment, the read operation of the read/write circuit 130 may be performed based on a charge integration using a bitline parasitic capacitor.

In an embodiment of the present disclosure, memory cells may be programmed page by page using an incremental step pulse programming (ISPP) technique on the basis of a verification process for checking whether a threshold voltage of a corresponding memory cell reaches a level of a target voltage. The ISPP technique may be performed by a current sensing circuit (not shown) coupled with the bitlines BL1 to BLm. In accordance with an embodiment, the current sensing circuit may be provided in the read/write circuit 130.

The control logic 180 may execute program-verify loops based on the ISPP technique, thereby programming selected memory cells. A pass/fail verification circuit (P/F VC) 150 verifies whether a programmed memory cell is at a desired level every time when a program loop count increases. If the programmed memory cell has a desired threshold voltage, that is, a target value, it may be determined as a program pass, and then the program operation and the verification operation on the programmed memory cell are terminated. However, if the programmed memory cell does not reach the target value, it may be determined as a program fail, and the pass/fail verification circuit 150 may generate a count signal (not shown). The pass/fail verification circuit 150 may determine a pass or a fail of the program operation, and then transmit the determined result to the control logic 180.

In response to a command CMD, the control logic 180 may control one or more of the row decoder 120, the read/write circuit 130, the column decoder 140, the pass/fail verification circuit 150, the program loop turn detector 160, and the comparator 170 to perform a pulsed program operation and a verification operation based on the ISPP technique. The program loop turn detector (PLTD) 160 and the comparator (CP) 170 may be circuits for determining whether a memory cell to be programmed, a string selection transistor, or both are abnormally slow cells or abnormally fast cells. In other embodiments, the program loop turn detector 160 and the comparator 170 may be omitted.

The control logic 180 may determine whether to terminate or continue a program operation according to the pass or fail result transmitted from the pass/fail verification circuit 150. When the fail result is received from the pass/fail verification circuit 150, the control logic 180 may cause a voltage generator (not shown) to generate a program voltage $V_{pgm}$ and a verification voltage $V_{vfy}$, and cause a page buffer 130 to proceed a subsequent program loop. As described above, to proceed a program operation based on an increasing turn number of program loops, the control logic 180 may receive a turn number of a program loop. On the contrary, when the control logic 180 receives the pass result, a program operation on selected memory cells will be terminated.

In various designs, the control logic 180 may be integrated on the same chip with the memory cell array 110. However, embodiments of the present disclosure are not limited thereto. In an embodiment, the control logic 180 may be implemented in a different chip from the memory cell array 110. For example, as in a solid state drive (SSD), the control logic 180 may be provided at a flash translation layer (FTL), which is an independent chip separated from the memory cell array 110.

Furthermore, although the pass/fail verification circuit 150, the program loop turn detector 160, and the comparator 170 are configured to be separate elements from the control logic 180, as shown in FIG. 1, embodiments of the present disclosure are not limited thereto. For example, at least one of the pass/fail verification circuit 150, the program loop turn detector 160, and the comparator 170 may be implemented as software or hardware in the control logic 180. Furthermore, at least one of the pass/fail verification circuit 150, the program loop turn detector 160, and the comparator 170 may be omitted or another circuit component may be added.

Figure 2A:
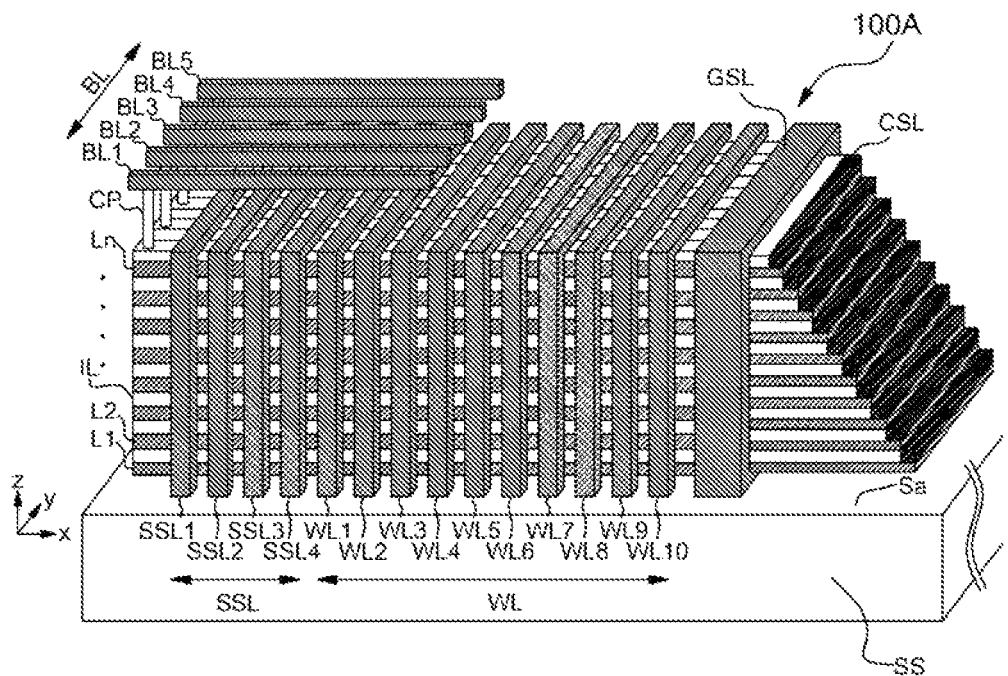
FIGS. 2A and 2B are perspective views showing 3D non-volatile memory devices including memory cell arrays, in accordance with embodiments of the present disclosure.
Figure 2B:
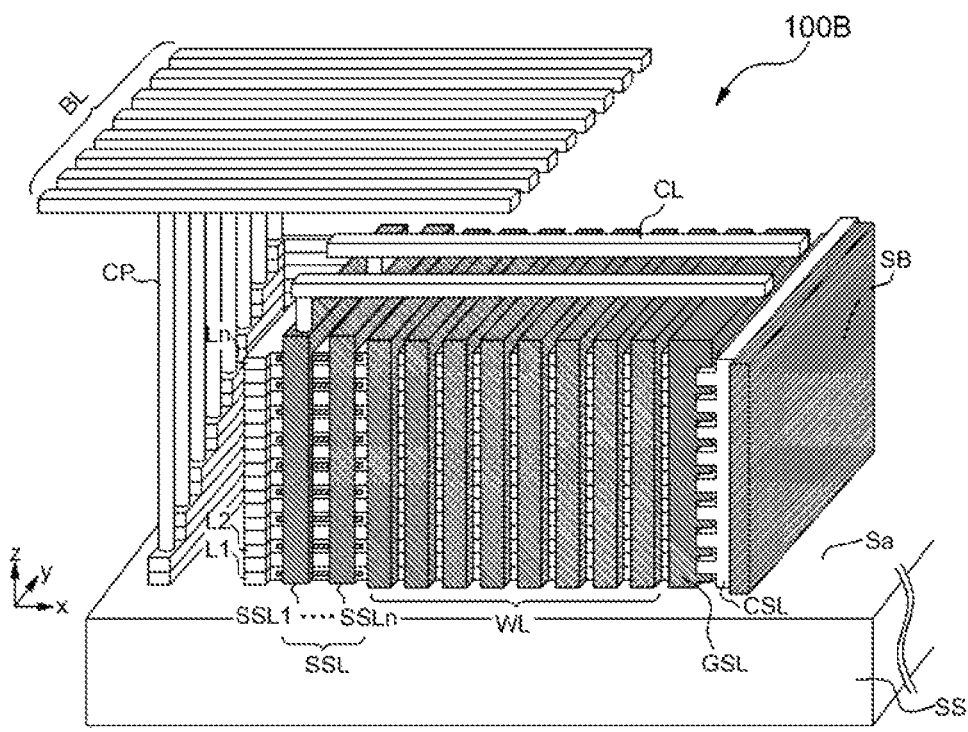

FIGS. 2A and 2B are perspective views showing 3D non-volatile memory devices 100A and 100B respectively including memory cell arrays (e.g., the memory cell array 110 of FIG. 1) in accordance with various embodiments of the present disclosure.

Referring to FIG. 2A, the 3D non-volatile memory device 100A may include memory cells that are arranged by being aligned in a first direction (e.g., x-axis direction), a second direction (e.g., y-axis direction), and in a third direction (e.g., z-axis direction). Both of the first and second directions are parallel to a main surface Sa of a substrate SS, and the third direction is perpendicular to the main surface Sa of the substrate SS. The substrate SS may be one of a semiconductor substrate, such as a Si monocrystalline substrate, a compound semiconductor substrate, a SOI substrate, and a strained substrate, but embodiments are not limited thereto. The substrate SS may also be a ceramic substrate, a polymer substrate for implementing a flexible device, or a fabric layer.

The first direction and the second direction may be orthogonal to each other. To form the above-stated memory cells, a plurality of memory layers L1 to Ln are stacked by interposing interlayer insulation layers IL therebetween. Each of the plurality of memory layers L1 to Ln may include a plurality of channel lines that respectively extend in the x-axis direction and adjacent channel lines are separated from each other at a predetermined distance in the y-axis direction. In accordance with an embodiment, the plurality of channel lines may be semiconductor material layers, each having a line shape. In the semiconductor material layers, suitable impurity regions may be formed to provide source/drain regions for a plurality of string selection transistors, memory cell transistors, or ground select transistors which will be described below. However, embodiments of the present disclosure are not limited thereto. For example, the memory cell transistors may be junctionless or junction-free memory cell transistors. In this case, the impurity regions for forming junctions between memory cells may be omitted.

The semiconductor material layer may contain a suitable n-type polysilicon, a polysilicon, or a p-type polysilicon according to a memory cell arrays architecture, such as a bit cost scalable (BiCs) structure, a vertical-recess-array-transistor (VRAT) structure, or a terabit cell array transistor (TCAT) structure. In accordance with another embodiment, the channel lines may be formed of a monocrystalline silicon, a compound semiconductor, a carbon-based material, a polymer material, or any of various other suitable channel materials other than conventional semiconductor materials.

Bitlines BL may be coupled with first ends of the plurality of channel lines, respectively. One bitline may be commonly coupled with first ends of corresponding channel lines of the memory layers L1 to Ln, and the corresponding channel lines are arranged in the z-axis direction to share the coupled bit line, and the sharing of the bitline by the channel lines can be secured via an interlayer conductive member, such as a via plug CP.

Common source lines CSL may be respectively connected to second ends of the plurality of channel lines. The common source lines CSL electrically connected to the second ends of the plurality of channel lines may be patterned to have a stair shape including steps, and a predetermined bias may be independently applied to a selected semiconductor layer by forming contact plugs (not shown) that contact respective steps of the common source lines CSL.

A plurality of wordlines WL may each extend in the y-axis direction and the z-axis direction, and adjacent wordlines WL are separated with each other at a predetermined distance in the x-axis direction. The plurality of wordlines WL may intersect with a plurality of channel lines in respective memory layers L1 to Ln to be shared by memory cells in the y-axis direction in the respective memory layers L1 to Ln. In this case, conductive layers constituting the plurality of wordlines WL may intersect with the plurality of channel lines, and data storage layers for storing data may be interposed between the conductive layers and the plurality of channel lines. The conductive layers may have a gate all around structure for surrounding the data storage layers, or a double gate structure for passing over the data storage layers.

In accordance with an embodiment, each of the plurality of memory cells may include a charge storage layer, such as a floating gate or a charge trapping layer which may be insulated from a corresponding channel line and a corresponding wordline respectively via a tunnel insulation layer and a blocking insulation layer. The charge storage layer may function as a data storage layer. For example, each of the plurality of memory cells having the charge trapping layer may have any one of a polysilicon-silicon dioxide-silicon nitride-silicon dioxide-silicon (SONOS) structure, a polysilicon-alumina-silicon nitride-silicon dioxide-silicon (SANOS) structure, a tantalum or titanium nitride-alumina-silicon nitride-silicon dioxide-silicon (TANOS), a metal-alumina-silicon nitride-silicon dioxide-silicon (MANOS) structure, or a metal-alumina-silicon nitride-band engineered oxide-silicon (Be-MANOS) structure, and each of the plurality of memory cells may be stacked in an order of a gate electrode, a blocking insulation layer, a charge trapping layer, a tunnel insulation layer, and a substrate. However, they are merely examples, and the charge trapping layer is not limited to a silicon nitride layer and may be formed of various other suitable candidate materials, for example, oxides of other transition metals or composite structures including structures having dispersed therein nano-crystals.

The conductive layers constituting the wordlines WL may extend onto the blocking insulation layer formed on the charge trapping layer. The plurality of memory cells may be electrically connected in series, and constitute memory strings. Although the 3D non-volatile memory devices 100A of FIG. 2A includes 10 wordlines WL1 to WL10, it is merely an example, and a number of the wordlines WL may be the same as a number of memory cells included in a single string, e.g., 32 or 64.

In accordance with an embodiment, the 3D non-volatile memory device 100A may include two or more string selection transistors formed at each of the channel lines. In accordance with an embodiment, the string selection transistors may be multi-level transistors that have a plurality of programmable states respectively corresponding to a plurality of threshold values (or threshold voltages). In accordance with an embodiment, the string selection transistors may be formed of the same material, and also may have substantially the same structure as that of the memory cells.

FIG. 2A shows that four string selection transistors are provided for each single channel line and four string selection lines SSL1, SSL2, SSL3, and SSL4 each extend in the y-axis and z-axis directions and adjacent string selection lines are separated from each other at a predetermined distance. As a result, each of the string selection lines SSL1, SSL2, SSL3, and SSL4 may be coupled with a corresponding plurality of string selection transistors that are arranged in a y-z plane. Similarly to the wordlines WL, the string selection lines SSL1, SSL2, SSL3, and SSL4 may have a structure surrounding data storage layers or extending over the data storage layers for controlling threshold values of the string selection transistors formed on the plurality of channel lines.

Although the four string selection lines SSL1, SSL2, SSL3, and SSL4 are shown in FIG. 2A, the number of string selection lines SSL is not limited thereto. The number of string selection lines SSL may be determined to allow independent selection of each of the memory layers L1 to Ln according to any combination of the number of the memory layers L1 to Ln and threshold values of the string selection transistors coupled with string selection lines SSL. Detailed descriptions thereof will be given below with reference to FIG. 4A.

The string selection lines SSL1, SSL2, SSL3, and SSL4 may pass across a plurality of memory layers L1 to Ln, where each of the string selection lines SSL1, SSL2, SSL3, and SSL4 may be coupled in common with string selection transistors which are stacked in the z-axis direction and arranged in the y-axis direction (or are arranged in y-z planes), and control the string selection transistors to program or erase selected string selection transistors. In addition, after the string selection transistors are completely initialized, the string selection lines SSL1, SSL2, SSL3 and SSL4 may be driven to select memory layers L1 to Ln by controlling the ON/OFF of the string selection transistors coupled with corresponding string selection lines SSL1, SSL2, SSL3 and SSL4 during the operation of the memory device. In an embodiment, the string selection lines SSL1, SSL2, SSL3, and SSL4 may be arranged between first ends of memory strings coupled with the bitlines BL and the first wordline WL1.

A ground selection line GSL may be disposed between the wordlines WL and the common source lines CSL. The ground selection line GSL passes across the plurality of memory layers L1 to Ln, where the ground selection line GSL may be coupled in common with ground select transistors stacked in the z-axis direction and arranged in the y-axis direction (or in y-z planes), to turn on or off the ground select transistors.

Referring to FIG. 2B, in accordance with an embodiment, the 3D non-volatile memory device 100B may include memory cells that are arranged in a first direction (e.g., an x-axis direction) and a second direction (e.g., a y-axis direction), and in a third direction (e.g., a z-axis direction). Both of the x-axis direction and the y-axis direction are parallel to a main surface Sa of a substrate SS, and the z-axis direction is perpendicular to the main surface Sa of the substrate SS. The above descriptions on the string selection lines SSL, the wordlines WL, and the ground selection line GSL of the 3D non-volatile memory device 100A of FIG. 2A may be similar to those of the 3D non-volatile memory device 100B as long as there is no contradiction therebetween. In addition, in the 3D non-volatile memory device 100a and 100b, wordlines WL, ground selection line GSL as well as string selection lines SSL may be electrically connected with peripheral circuits (e.g., row decoder 120) via suitable interconnection conductors CL.

In the 3D non-volatile memory device 100B, a semiconductor body SB may be coupled with a common source line CSL. Although, in the embodiment of FIG. 2B, the ground selection line GSL, the common source line CSL, and the semiconductor body SB are sequentially arranged in the x-direction, it is merely an example, and, in another embodiment, the ground selection line GSL, the semiconductor body SB, and the common source line CSL are sequentially arranged in the x-direction. The common source lines CSL may be also patterned to have a stair shape including steps, and contact plugs (not shown) contacting the respective steps are formed as described in FIG. 2A to apply a bias independently to a selected memory layer.

Figure 3A:
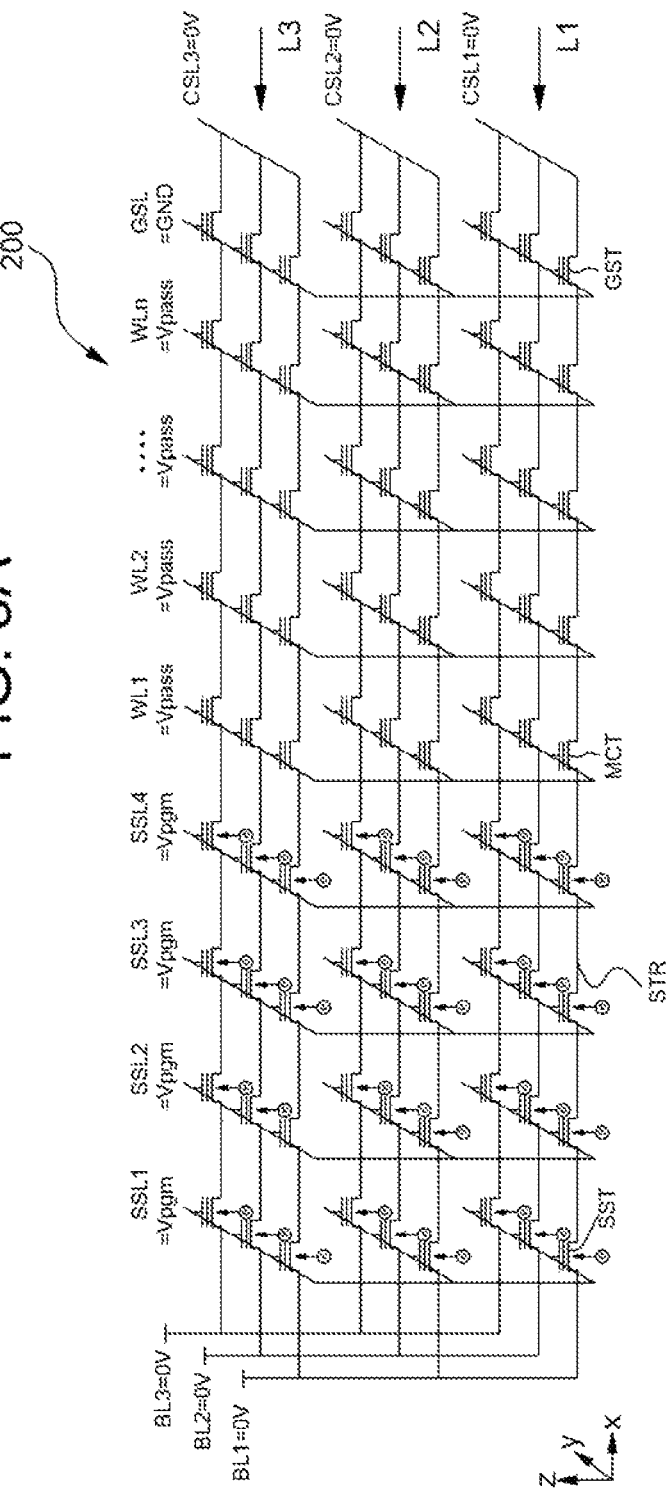
Figure 3B:
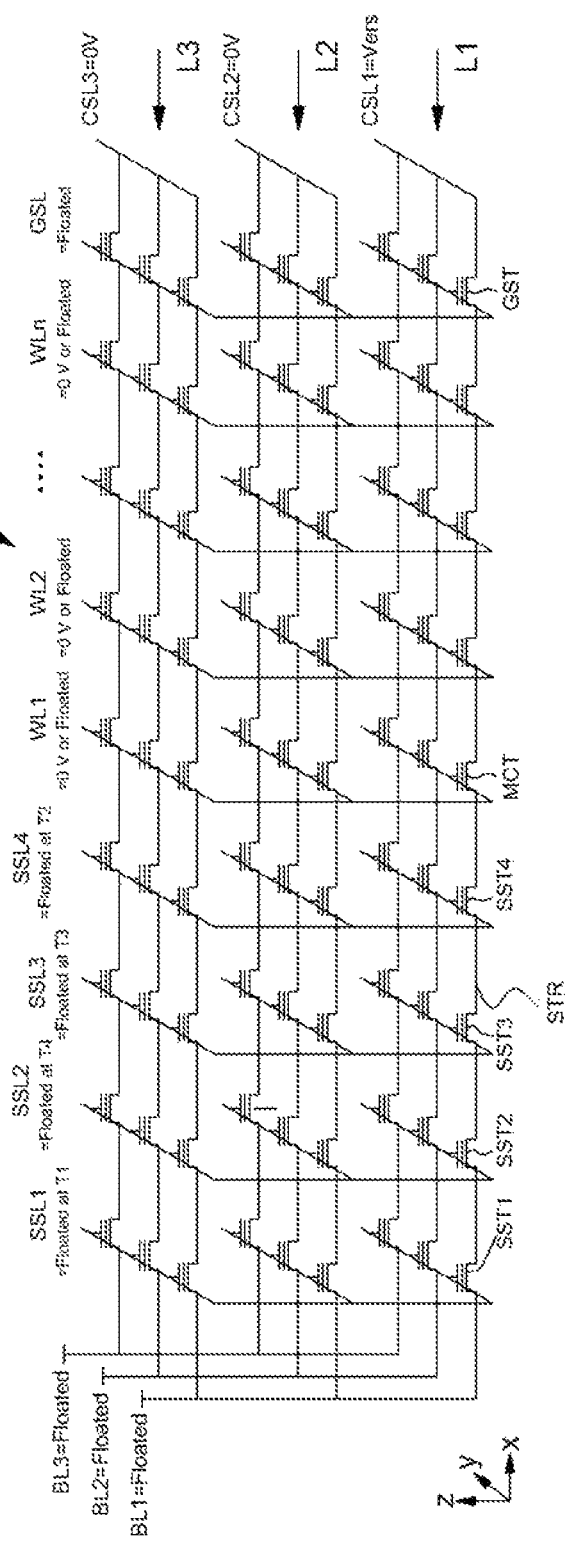
Figure 4A:
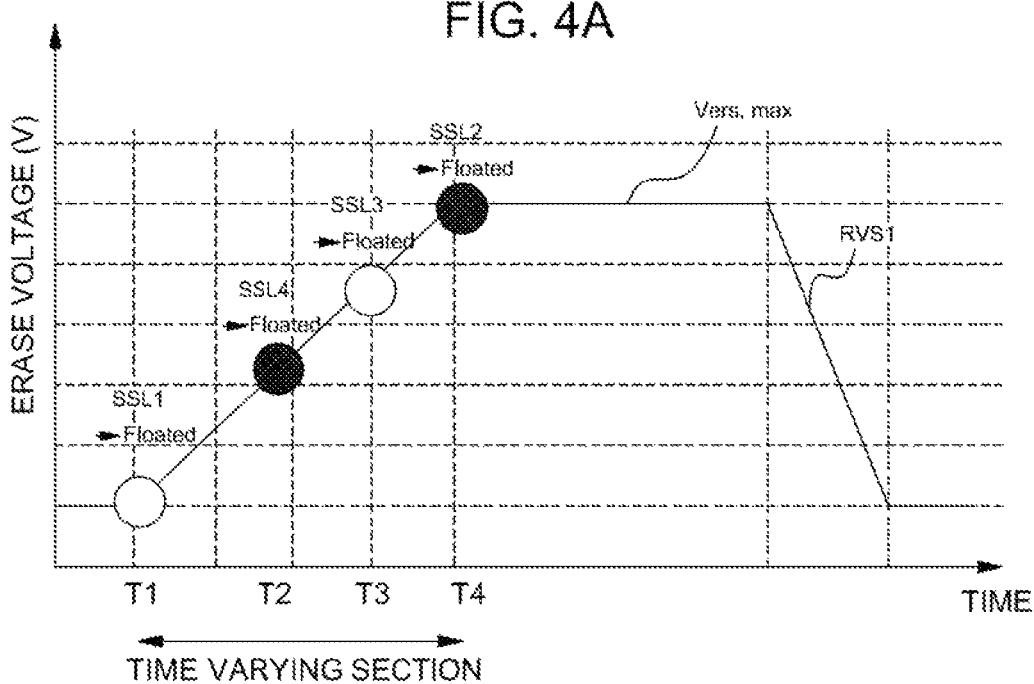
FIGS. 4A and 4B illustrate erase voltage signals and operations of string selection lines based on the erase voltage signals, in accordance with embodiments of the present disclosure.
Figure 4B:
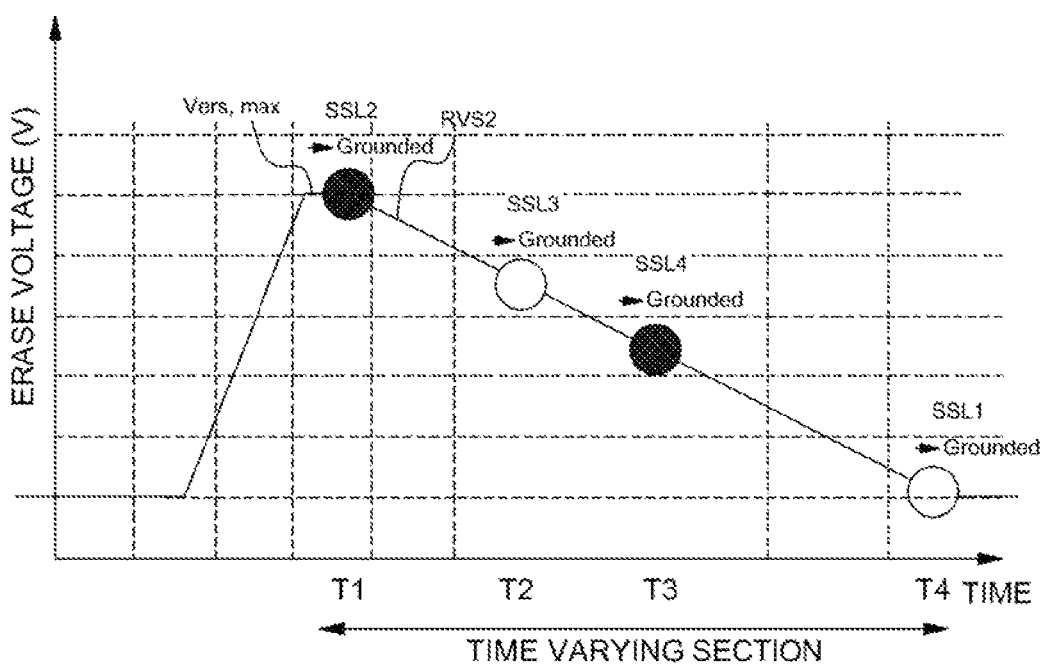

FIGS. 3A to 3C are circuit diagrams illustrating a process of initializing string selection transistors SST of a 3D non-volatile memory device 200 in accordance with an embodiment. FIGS. 4A and 4B illustrate erase voltage signals and operations of the string selection lines SSL1, SSL2, SSL3, and SSL4 of FIG. 3B based on the erase voltage signals in accordance with embodiments of the present disclosure. Descriptions given above with reference to FIGS. 1, 2A, and 2B may be referred to for the 3D non-volatile memory device 200.

Referring to FIG. 3A, the 3D non-volatile memory device 200 having three memory layers L1, L2, and L3 stacked in a z-axis direction is shown, wherein each of the memory layers L1, L2, and L3 may include memory strings STR that respectively extend in an x-axis direction and adjacent memory strings STR are separated from each other at a predetermined distance in a y-axis direction. Each of the memory strings STR may include a channel line. The channel line may have a structure corresponding to a channel stacked type shown in FIG. 3A, but embodiments of the present disclosure are not limited thereto. For example, the memory string STR may have a structure including a channel line extending in a direction vertical to a substrate, e.g., a straight-shaped bit cost scalable (BiCs) structure, a pipe-shaped BiCs structure, other vertical channel structure, or a combination thereof.

Although FIG. 3A shows that each of the memory layers L1, L2, and L3 include three memory strings STR that are spaced apart from one another and are arranged in the y-axis direction, it is merely an example, and the number of the memory strings STR arranged in the y-axis direction may vary in accordance with a desirable size of a logical page.

Bitlines BL1, BL2, and BL3 may be coupled with first ends of the memory strings STR, whereas common source lines CSL1, CSL2, and CSL3 may be coupled with second ends of the memory strings STR. Specifically, each of the bitlines BL1, BL2, and BL3 may be coupled with first ends of a first plurality of memory strings STR that are arranged in the z-direction, and each of the common source lines CSL1, CSL2, and CSL3 may be coupled with second ends of a second plurality of memory strings STR that are arranged in the y-direction. String selection lines SSL1, SSL2, SSL3, and SSL4, may be coupled with gate electrodes of string selection transistors SST of the memory strings STR, wordlines WL1 to WLn may be coupled with gate electrodes of memory cell transistors MCT, and a ground selection line GSL may be coupled with gate electrodes of ground select transistors GST.

In order to perform driving operations for programming or reading selected memory cells, the string selection transistors SST are initialized to have a predetermined state in advance. To this end, an initial levelling operation (or an initialization operation) for programming threshold values of the string selection transistors SST to have a predetermined target level may be performed on the string selection transistors SST belonging to some or all of the plurality of memory layers L1, L2, and L3. In an embodiment, the target level of the string selection transistors SST may be identical to one another. In other embodiment, the memory layers L1, L2, and L3 may have different target levels from one another.

In an embodiment, a program operation for charging charge storage layers of the string selection transistors SST may be performed using the Fowler-Nordheim tunnelling mechanism. Using the program operation, the string selection transistors SST may be programmed to have a threshold voltage (or a threshold value) corresponding to a predetermined target level. FIG. 3A illustrates that data storage layers of the string selection transistors SST are filled with electrons (that is, negative charges), such that the string selection transistors SST may have the predetermined target level.

In an embodiment, an initial levelling operation for programming the string selection transistors SST may be performed to make the string selection transistors SST have a predetermined target level by grounding all of the bitlines BL1, BL2, and BL3, applying high program voltages $V_{pgm}$ (e.g., from about 20 V to about 25 V) to the string selection lines SSL1, SSL2, SSL3, and SSL4, and grounding the ground selection line GSL. The common source lines CSL1, CSL2, and CSL3 may be grounded. During the initial levelling operation, pass voltages $V_{pass}$ (e.g., low positive voltages from about 8 V to about 10 V) may be applied to the wordlines WL1 to WLn, such that the memory cell transistors MCT disposed in the channel lines may become pass transistors.

In an embodiment, the initial levelling operation may be performed based on the ISPP technique and the verification technique. In accordance with an embodiment, the ISPP technique and the verification technique may be performed bit-by-bit with respect to each of the memory layers L1, L2, and L3. Although the embodiment shown in FIG. 3A shows that the initial levelling operation is performed with respect to all of the memory layers L1, L2, and L3 at the same time, it is merely an example, and embodiments of the present disclosure are not limited thereto. The initial levelling operation may performed with respect to one or more of the plurality of memory layers L1, L2, and L3.

Referring to FIG. 3B, after the initial levelling operation, an erase voltage signal (referred to hereinafter as a time varying erase voltage signal) having a predetermined time varying section may be applied to a plurality of channel lines in a selected memory layer among the memory layers on which the initial levelling operation was performed. The time varying erase voltage signal may be generated by a suitable ramp circuit or a timing circuit, where such a circuit may be provided in a row decoder (e.g., the row decoder 120 of FIG. 1). However, embodiments of the present disclosure are not limited thereto.

FIG. 3B shows that the lowermost memory layer L1 is selected and a time varying erase voltage signal $V_{ers}$ is applied via the corresponding common source line CSL1. As shown in FIG. 3B, the remaining common source lines CSL2 and CSL3 of the unselected memory layers L2 and L3 may be grounded, or an erase inhibit voltage or an appropriate voltage signal for preventing programming disturbance may be applied thereto.

Referring to FIGS. 4A and 4B, the time varying erase voltage signal $V_{ers}$ may be a first ramping erase voltage signal RVS1 having an increasing ramp section as shown in FIG. 4A, or a second ramping erase voltage signal RVS2 having a decreasing ramp section as shown in FIG. 4B. FIGS. 4A and 4B show that profiles of the increasing and decreasing ramp sections (or time varying sections) of the first and second ramping erase voltage signals RVS1 and RVS2, respectively, vary linearly with time. However, embodiments of the present disclosure are not limited thereto. For example, the time varying erase voltage signal $V_{ers}$ of FIG. 3B may have a signal profile having one or more steps that discretely increase or decrease, a curved (e.g., non-linear) profile that continuously increases or decreases, or a combination thereof.

Referring back to FIG. 3B, in accordance with an embodiment, while the time varying erase voltage signal $V_{ers}$ is being applied to the selected memory layer L1, the bitlines BL1, BL2, and BL3 may be electrically floated. The wordlines WL respectively coupled with corresponding memory cell transistors MCT may be grounded or electrically floated. When the wordlines WL are grounded, the coupled memory cell transistors MCT may be erased. When the wordlines WL are floated, potentials of the floated wordlines WL may be increased by capacitive coupling between the floated wordlines WL and corresponding channel lines, and thus erase inhibition may be induced at the coupled memory cell transistors MCT. Furthermore, while the time varying erase voltage signal $V_{ers}$ is being applied, the ground selection line GSL may be floated.

While the time varying erase voltage signal $V_{ers}$ is being applied, to change states of the string selection transistors SST1, SST2, SST3, and SST4 (that is, to set threshold values of the string selection transistors SST1, SST2, SST3, and SST4), the string selection lines SSL1, SSL2, SSL3, and SSL4 may be respectively controlled during a time interval corresponding to the time varying section. Thus, erased degrees (or erased levels) of the string selection transistors SST1, SST2, SST3, and SST4 are different. Specifically, the erased degrees of the string selection transistors SST1, SST2, SST3, and SST4 correspond to respective amounts of changes in the threshold voltages of the string selection transistors SST1, SST2, SST3, and SST4 from the initialized target level. Preferably, all of the string selection transistors SST1, SST2, SST3, and SST4 have respective threshold values during a time interval corresponding to a single time varying section of the time varying erase voltage signal $V_{ers}$. In an embodiment, the threshold values of the string selection transistors SST1, SST2, SST3, and SST4 may be different from one another.

Referring to FIGS. 4A and 3B, the first ramping erase voltage signal RVS1 having an increasing ramp section is applied to the common source line CSL1 of the selected memory layer L1 of the 3D non-volatile memory device 200. For example, when the string selection lines SSL1, SSL2, SSL3, and SSL4 that were in the initial ground state become floated respectively at two or more different time points (e.g., time points T1, T4, T3, and T2) during the time varying section of the first ramping erase voltage signal RVS1, operations for erasing the string selection transistors SST1, SST2, SST3, and SST4 coupled in the y-axis direction with the string selection lines SSL1, SSL2, SSL3, and SSL4 may be terminated at the respective time points T1, T4, T3, and T2 at which the string selection lines SSL1, SSL2, SSL3, and SSL4 become floated. As a result, threshold values (or threshold voltages) Vth1, Vth2, Vth3, and Vth4 of the respective string selection transistors SST1, SST2, SST3, and SST4 may be set to values that are different from one another, e.g., 3 V, −3 V, −1 V, and 1 V according to the erased degrees of the respective string selection transistors SST1, SST2, SST3, and SST4. Therefore, for example, respective voltages of the floated string selection lines SSL1, SSL2, SSL3, and SSL4 capacitively coupled therewith may be about 17 V, about 0 V, about 5 V, and about 10 V, respectively. Although not shown, when there are two or more string selection transistors floated at the same time point, these string selection transistors may have substantially the same threshold value.

If the string selection lines SSL1, SSL2, SSL3, and SSL4 are shared by a plurality of memory layers, a program disturbance, which may lead to an unwanted program operation on an unselected memory layer due to potentials of the string selection lines SSL1, SSL2, SSL3, and SSL4, may occur. Therefore, in an embodiment, a voltage (e.g., a voltage of about 10 V) smaller than the maximum voltage (e.g., a voltage of about 20 V, referring to $V_{ers,max}$ of FIGS. 4A and 4B) of the time varying erase voltage signal, may be applied to the common source lines CSL2 and CSL3 of the unselected memory layers L2 and L3 as a voltage signal for erase inhibition, thereby preventing an occurrence of the program disturbance at the unselected memory layers L2 and L3.

Since the voltage signal for erase inhibition may induce a gate-induced-drain-leakage (GIDL) at the common source lines CSL2 and CSL3 of the unselected memory layers L2 and L3, the program disturbance may be suppressed as a level of the voltage signal for erase inhibition increases. However, when the level of the voltage signal for erase inhibition is excessively high, a channel potential may become sufficiently high to induce soft erase of the string selection transistors SST. Therefore, the voltage signal for erase inhibition may have a level sufficiently low not to induce the soft erase of the unselected string selection transistors SST.

Although the time varying section of the first ramping erase voltage signal RVS1 of FIG. 4A corresponds to a linearly increasing ramp signal, embodiments of the present disclosure are not limited thereto. For example, as described above, the time varying section may have a nonlinear signal profile, such as a step-wise profile, a curved profile, or a combination thereof.

In another embodiment, referring to FIG. 4B and FIG. 3B, the second ramping erase voltage signal RVS2 having a decreasing ramp section is applied to the common source line CSL1 of the selected memory layer L1 of the 3D non-volatile memory device 200. For example, when the string selection lines SSL1, SSL2, SSL3, and SSL4 that were in the floated state become grounded respectively at the time points T4, T1, T2, and T3 during the time varying section of the second ramping erase voltage signal RVS2, operations for erasing the string selection transistors SST1, SST2, SST3, and SST4 respectively coupled in the y-axis direction with the string selection lines SSL1, SSL2, SSL3, and SSL4 may start at the respective time points T4, T1, T2, and T3 at which the string selection lines SSL1, SSL2, SSL3, and SSL4 become grounded. As a result, threshold values (or threshold voltages) Vth1, Vth2, Vth3, and Vth4 of the respective string selection transistors SST1, SST2, SST3, and SST4 may be set to values that are different from one another, e.g., 3 V, −3 V, −1 V, and 1 V. Therefore, respective voltages of the floated string selection lines SSL1, SSL2, SSL3, and SSL4 capacitively coupled therewith may become about 17 V, about 0 V, about 5 V, and about 10 V, respectively. Although not shown, when there are two or more string selection transistors grounded at the same time point, these string selection transistors may have substantially the same threshold value.

Although the time varying section of the second ramping erase voltage signal RVS2 of FIG. 4B corresponds to a linearly decreasing ramp signal, embodiments of the present disclosure are not limited thereto. For example, as described above, the time varying section may have a nonlinear signal profile, such as a step-wise profile, a curved profile, or a combination thereof. For example, the time varying erase voltage signal $V_{ers}$ of FIG. 3B may have a signal profile, in which a ramping section and a step-like section alternate, or a step section gradually increases. Specifically, the step-like section has a stair shape including a plurality of steps, and when the step section gradually increases the step section includes a plurality of steps and a difference between adjacent steps gradually increases during a time interval corresponding to the step section.

In accordance with the above-described embodiments, by using the time varying erase voltage signal $V_{ers}$ having a time varying section (e.g., the increasing ramp section of FIG. 4A or the decreasing ramp section of FIG. 4B), the string selection lines SSL1, SSL2, SSL3, and SSL4 coupled with the selected memory layer L1 may be switched from a ground state to a floated state or from the floated state to the ground state respectively at particular time points. Accordingly, the string selection transistors SST1, SST2, SST3, and SST4, which are disposed in the selected memory layer L1 and respectively coupled with the string selection lines SSL1, SSL2, SSL3, and SSL4, may be set to have four different threshold values. Although the threshold values of the string selection transistors SST1, SST2, SST3, and SST4 are different from one another in the above-stated embodiments, embodiments of the present disclosure are not limited thereto, and at least two of the string selection transistors SST may have substantially the same threshold value when the at least two of the string selection transistors SST are floated or grounded at the same time point.

As described above, when the threshold values of the string selection transistors SST1, SST2, SST3, and SST4 disposed in the selected memory layer L1 are completely set, an operation for setting threshold values of string selection transistors may be repeatedly performed to the remaining memory layers L2 and L3. FIG. 3C illustrates such an operation for setting threshold values for initialized string selection transistors SST1, SST2, SST3, and SST4 in the selected memory layer L2 adjacent to the memory layer L1. Referring to FIG. 3C, a time varying erase voltage signal $V_{ers}$ may be applied via the common source line CSL2 of the selected memory layer L2. Appropriate voltage signals may be applied to the common source lines CSL1 and CSL3 of the unselected memory layers L1 and L3, or the common source lines CSL1 and CSL3 may be grounded.

The time varying erase voltage signal $V_{ers}$ may be the first ramping erase voltage signal RVS1 having an increasing ramp section as shown in FIG. 4A or the second ramping erase voltage signal RVS2 having a decreasing ramp section as shown in FIG. 4B. Furthermore, although not shown, the time varying erase voltage signal $V_{ers}$ may be a nonlinear erase voltage signal, such as a step-wise erase voltage signal, a curved erase voltage signal, or a combination of such signals. For example, the time varying erase voltage signal $V_{ers}$ may have a signal profile, in which a ramping section and a step-like section alternate, or a step section that gradually increases or decreases. As shown in FIG. 3C, during the time varying section of the time varying erase voltage signal $V_{ers}$, the string selection lines SSL1, SSL2, SSL3, and SSL4 that were in the ground state may become electrically floated at different time points, e.g., T2, T1, T4 and T3. As a result, threshold values Vth1, Vth2, Vth3, and Vth4 of the respective string selection transistors SST1, SST2, SST3, and SST4 in the selected memory layer L2 may be set to different values from one another.

As described above, when the time varying erase voltage signal $V_{ers}$ including the time varying section is applied via one of the common source line CSL1, CSL2, and CSL3, which corresponds to a selected memory layer L1, L2, or L3, erased degrees of the string selection transistors SST1, SST2, SST3, and SST4 coupled to the common source line CSL1, CSL2, or CSL3 are controlled by changing a voltage applied to the string selection lines SSL1, SSL2, SSL3, and SSL4 during the time varying section. Thus, the coupled string selection transistors SST1, SST2, SST3, and SST4 that are arranged in the x-axis direction and disposed in the selected memory layer L1, L2, or L3 are set to have predetermined threshold values. The threshold values of the string selection transistors SST1, SST2, SST3, and SST4 in the memory layers L1 and L2 are set as described above, and then threshold values of string selection transistors of the remaining memory layer L3 may also be set in the same manner.

As described above, when all of threshold values of the string selection transistors of the memory layers L1, L2, and L3 are set, a particular memory layer may be selected without a disturbance of the other layers, and a program operation, a read operation, or an erase operation may be performed on an addressed memory cell in the selected memory layer by using a method identical to or similar to a 2D memory cell addressing method in the related art.

Figure 5A:
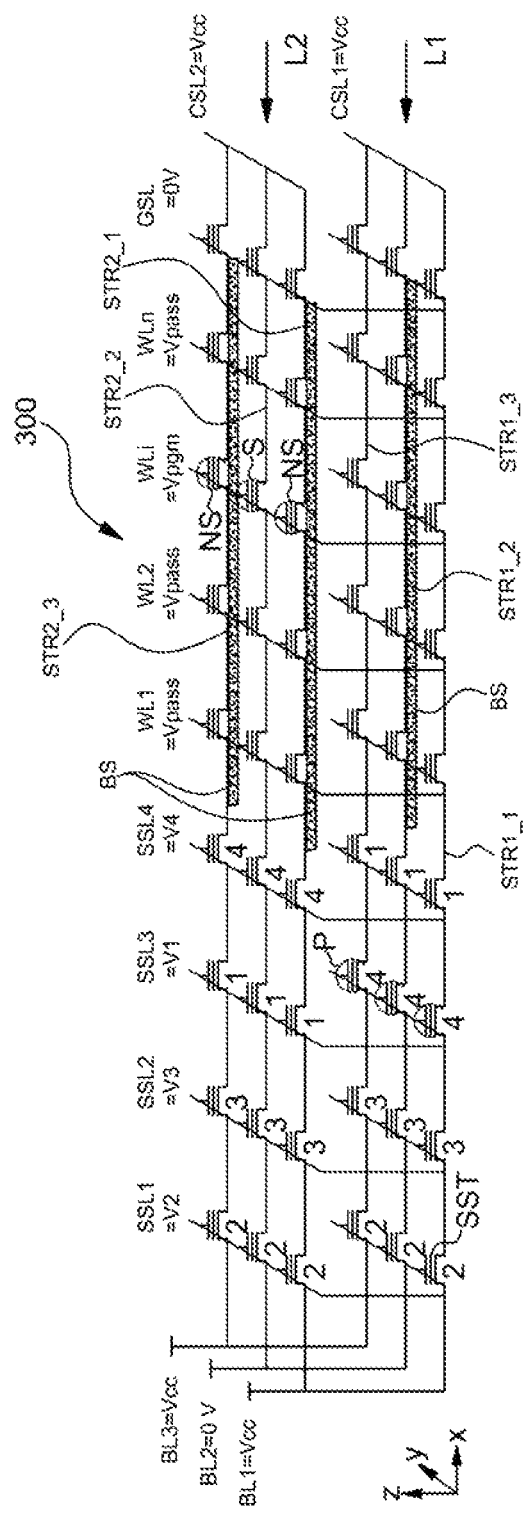
FIG. 5A is a circuit diagram illustrating a non-volatile memory device including string selection transistors initialized in accordance with an embodiment of the present disclosure.
Figure 5B:
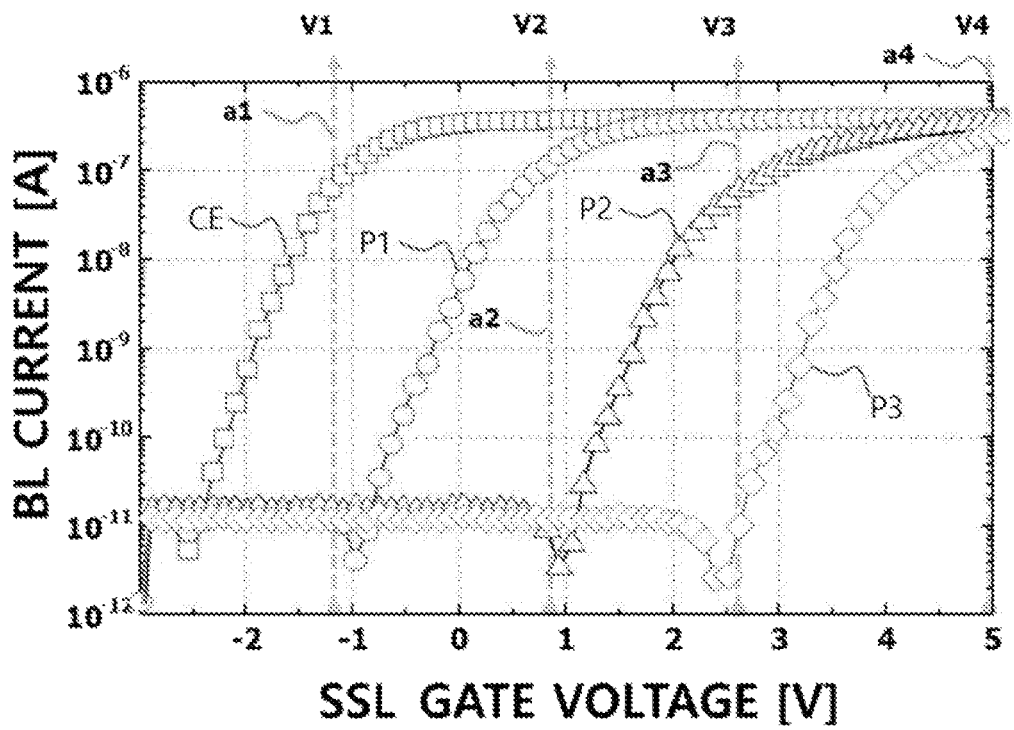
FIG. 5B is a graph showing measured transfer characteristics of string selection transistors initialized to multi levels, in accordance with an embodiment of the present disclosure.
Figure 5C:
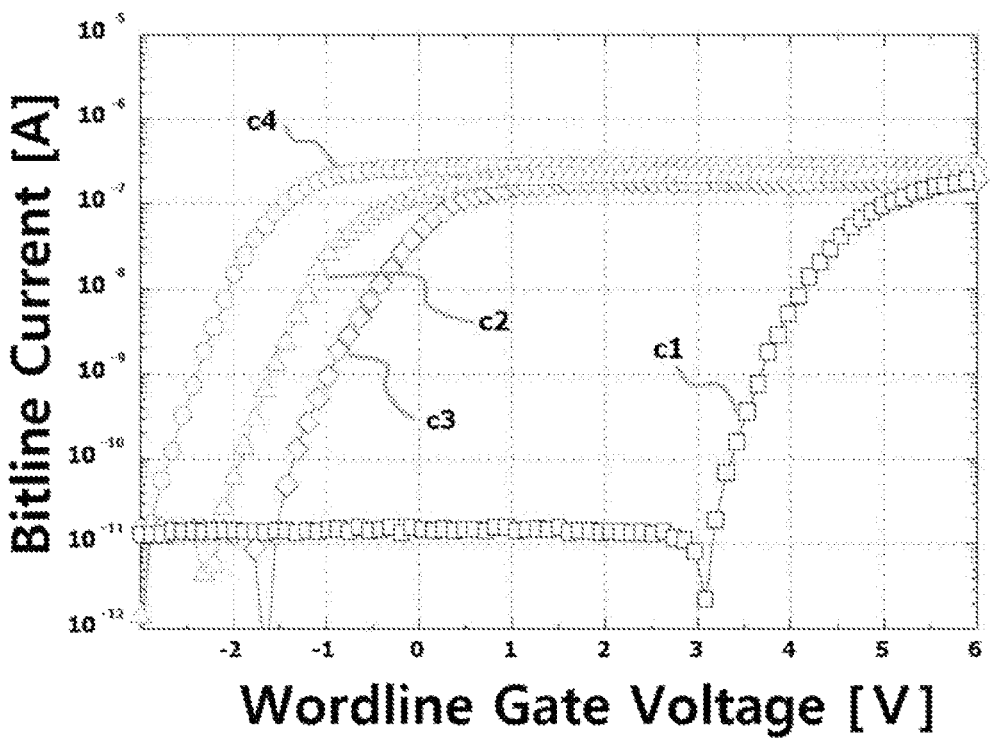
FIG. 5C is a graph showing measured transfer characteristics of a programmed memory cell, and an unselected and inhibited memory cell in the selected memory layer, and an unselected and inhibited memory cell in an unselected memory layer in accordance with an embodiment of the present disclosure.

FIG. 5A is a circuit diagram illustrating a non-volatile memory device 300 including string selection transistors initialized in accordance with an embodiment of the present disclosure, FIG. 5B is a graph showing measured transfer characteristics of string selection transistors SST initialized to multi levels in accordance with an embodiment of the present disclosure, and FIG. 5C is a graph showing measured transfer characteristics of a programmed memory cell and an unselected and inhibited memory cell in a selected memory layer, and an unselected and inhibited memory cell in an unselected memory layer.

Each of first and second memory layers L1 and L2 of the non-volatile memory device 300 of FIG. 5A in accordance with an embodiment may be selected by a multi-level operation scheme. Specifically, a layer selection by multi-level scheme (LSM) is performed such that a memory layer in which all the string selection transistors are turned on may be selected, whereas another memory layer in which even one of string selection transistors is turned off may be unselected. Referring to FIG. 5A, numbers 1, 2, 3, and 4 allocated to each of the string selection transistors SST indicate states corresponding to respective threshold values of the string selection transistors SST. For example, the states of the string selection transistors SST indicated by the numbers 1, 2, 3, and 4 may respectively correspond to −1 V, 1 V, 3 V, and 5 V of the threshold values Vth as shown in Table 1 below. Voltages V2, V3, V1, and V4 shown in FIG. 5B respectively allocated to the string selection lines SSL1, SSL2, SSL3, and SSL4 of FIG. 5A, indicate values of voltages applied to the respective string selection lines SSL1, SSL2, SSL3, and SSL4 for selecting a memory layer L2. The Curves CE, P1, P2 and P3 of the measured transfer characteristics of string select transistors SST correspond to states 1, 2, 3 and 4, respectively. Table 1 exemplifies a case where the voltages V2, V3, V1, and V4 are respectively applied to the string selection lines SSL1, SSL2, SSL3, and SSL4. Here, the values of the voltages V1, V2, V3, and V4 are indicated by arrows a1, a2, a3, and a4 shown in FIG. 5B, respectively.

TABLE 1

| SST State | $V_{th}$ of SST | SSL1 | SSL2 | SSL3 | SSL4 |
|---|---|---|---|---|---|
| 1 | −1 V | V2 | V3 | V1 | V4 |

TABLE 1-continued

| SST State | $V_{th}$ of SST | SSL1 | SSL2 | SSL3 | SSL4 |
|---|---|---|---|---|---|
| 2 | 1 V | V2 | V3 | V1 | V4 |
| 3 | 3 V | V2 | V3 | V1 | V4 |
| 4 | 5 V | V2 | V3 | V1 | V4 |

Referring back to FIG. 5A, as shown in Table 1, when the states of respective string selection transistors SST are set and corresponding voltages are respectively applied to the string selection transistors SST, a plurality of string selection transistors each indicated by a dotted line circle P among the string selection transistors SST are turned off, and the other string selection transistors are turned on. Because the turned off string selection transistors are disposed in the first memory layer L1, the second memory layer L2 may be selected.

Although the above-described embodiment includes four string selection lines SSL1, SSL2, SSL3, and SSL4, the number of string selection lines may be reduced for increasing integration density of the memory device 300. According to an embodiment, since each of string selection transistors has two or more multi-level threshold values, a layer may be selected based on the LSM scheme.

For example, a plurality of string selection transistors arranged in the y-axis direction and stacked in the z-axis direction (or in an y-z plane) for sharing respective selection lines may be initialized such that threshold values of the plurality of string selection transistors gradually increase or decrease in the z-axis direction. In this case, if a number of the shared string selection lines is r, a number of accessible memory layers may be $2^r$ when the r is an even number or may be $2^{r-1}$ when the r is an odd number. Table 2 below shows values of bias voltages to be applied to respective string selection lines for selecting each memory layer with 4 string lines when a 3D stacked non-volatile memory device in accordance with an embodiment includes 16 memory layers. In accordance with an embodiment of the present disclosure, the number of string selection transistors for selecting memory layers may be exponentially reduced in the LSM scheme, and string selection transistors having multi-level states may be initialized with a single signal having one time varying section.

TABLE 2

| Memory Layer | Threshold Value | | | | SSL Bias | | | |
|---|---|---|---|---|---|---|---|---|
| | 1st SST | 2nd SST | 3rd SST | 4th SST | 1st SSL | 2nd SSL | 3rd SSL | 4th SSL |
| 1st Layer | 3 V | −1 V | 3 V | −1 V | 3.5 V | 0 V | 3.5 V | 0 V |
| 2nd Layer | 3 V | −1 V | 2 V | 1 V | 3.5 V | 0 V | 2.5 V | 1.5 V |
| 3rd Layer | 3 V | −1 V | 1 V | 2 V | 3.5 V | 0 V | 1.5 V | 2.5 V |
| 4th Layer | 3 V | −1 V | −1 V | 3 V | 3.5 V | 0 V | 0 V | 3.5 V |
| 5th Layer | 2 V | 1 V | 3 V | −1 V | 2.5 V | 1.5 V | 3.5 V | 0 V |
| 6th Layer | 2 V | 1 V | 2 V | 1 V | 2.5 V | 1.5 V | 2.5 V | 1.5 V |
| 7th Layer | 2 V | 1 V | 1 V | 2 V | 2.5 V | 1.5 V | 1.5 V | 2.5 V |
| 8th Layer | 2 V | 1 V | −1 V | 3 V | 2.5 V | 1.5 V | 0 V | 3.5 V |
| 9th Layer | 1 V | 2 V | 3 V | −1 V | 1.5 V | 2.5 V | 3.5 V | 0 V |
| 10th Layer | 1 V | 2 V | 2 V | 1 V | 1.5 V | 2.5 V | 2.5 V | 1.5 V |
| 11th Layer | 1 V | 2 V | 1 V | 2 V | 1.5 V | 2.5 V | 1.5 V | 2.5 V |
| 12th Layer | 1 V | 2 V | −1 V | 3 V | 1.5 V | 2.5 V | 0 V | 3.5 V |
| 13th Layer | −1 V | 3 V | 3 V | −1 V | 0 V | 3.5 V | 3.5 V | 0 V |
| 14th Layer | −1 V | 3 V | 2 V | 1 V | 0 V | 3.5 V | 2.5 V | 1.5 V |
| 15th Layer | −1 V | 3 V | 1 V | 2 V | 0 V | 3.5 V | 1.5 V | 2.5 V |
| 16th Layer | −1 V | 3 V | −1 V | 3 V | 0 V | 3.5 V | 0 V | 3.5 V |

In accordance with an embodiment of the present disclosure, since memory cells in an yz plane are arranged in a matrix-like shape, the memory cells coupled commonly with a selection line WLi, which is selected for programming a selected memory cell S, may be biased with a high programming voltage $V_{pgm}$. In this case, while the selected memory cell S is being programmed, an unwanted program or a disturbance may occur at unselected memory cells NS coupled to the selection line WLi. Therefore, it is desirable for an operation for programming the selected memory cell S to have bit selectivity. In an embodiment, a bitline program voltage, e.g., 0 V, may be applied to a second bitline BL2 connected to a memory string STR2_2 including the memory cell S to be programmed, whereas a higher voltage for example, a common collector voltage (or a power voltage) Vcc, e.g., about 2.3 V, may be applied to first and third bitlines BL1 and BL3 that are respectively connected to the other memory strings STR2_1 and STR2_3. At least one or more string selection transistors of the other memory strings STR2_1 and STR2_3 are turned off by the higher voltage (i.e., the common collector voltage) Vcc, and thus the unselected memory strings STR2_1 and STR2_3 may be biased to a high channel potential, e.g., 8 V, reducing a voltage drop via a tunnelling insulation layer of a memory cell in the unselected memory strings STR2_1 and STR2_3. As a result, a self-boosted program inhibition (SBPI) scheme (or SBPI mode) for preventing electrons from tunnelling from a channel to a data storage layer may be performed.

Another SBPI scheme in which the program operation has bit selectivity may be performed. To this end, each of strings may further include a dummy select transistor (not shown), where the common collector voltage Vcc may be applied to a dummy string selection line coupled with the dummy select transistor and the bitlines BL1 and BL3 of the unselected strings STR2_1 and STR2_3. As a result, the dummy select transistor is turned off, channels of the unselected strings STR2_1 and STR2_3 may become floated, and channel potentials of the unselected memory cells NS sharing the wordline WLi may be boosted via a capacitive coupling. Thus, a program operation on the unselected memory cells NS may be inhibited. A hatched region indicated by the reference character BS denotes a channel with a boosted potential.

Although a pass voltage $V_{pass}$ is applied to the remaining wordlines WL1 to WLi−1 and WLi+1 to WLn coupled with the unselected memory cells in the embodiment shown in FIG. 5A, embodiments of the present disclosure are not limited thereto. For example, a program voltage $V_{pgm}$ may be applied to the wordline WLi of the selected memory cell S, two wordlines WLi−1 and WLi+1 coupled with two unselected memory cells adjacent to the selected memory cell S in a same string may be grounded, and the pass voltage $V_{pass}$ may be applied to the remaining wordlines WL1 to WLi−2 and WLi+2 to WLn.

In another embodiment, during a program operation, to suppress a program disturbance like a soft erase, a pass disturbance, or an edge disturbance, the program operation may be performed in accordance with a local SBPI scheme or an asymmetric SBPI scheme.

FIG. 5C shows a first response C1 of a selected memory string of a selected memory layer that is programmed, a second response C2 of an unselected memory string of the selected memory layer, and a third response C3 of the remaining memory strings of an unselected memory layer that are program-inhibited, and thus a reliable program operation suppressing the program disturbance may be performed.

The program operation may be performed by using the ISPP technique for controlling a threshold value Vth programmed based on a bit-by-bit program-verification algorithm as described above. Furthermore, although the above embodiments have been described in relation to program operations, a memory layer may also be selected by an LSM scheme in accordance with an embodiment of the present disclosure to perform a read operation and an erase operation. The read operation or the erase operation may be performed by applying a read voltage $V_{read}$ (e.g., 0 V) or an erase voltage $V_{ers}$ (e.g., a negative voltage or a ground voltage) to a selected wordline in a selected memory layer and applying a pass voltage $V_{pass}$ (e.g., from 4 V to 5 V) to unselected wordlines in the selected memory layer.

Figure 6:
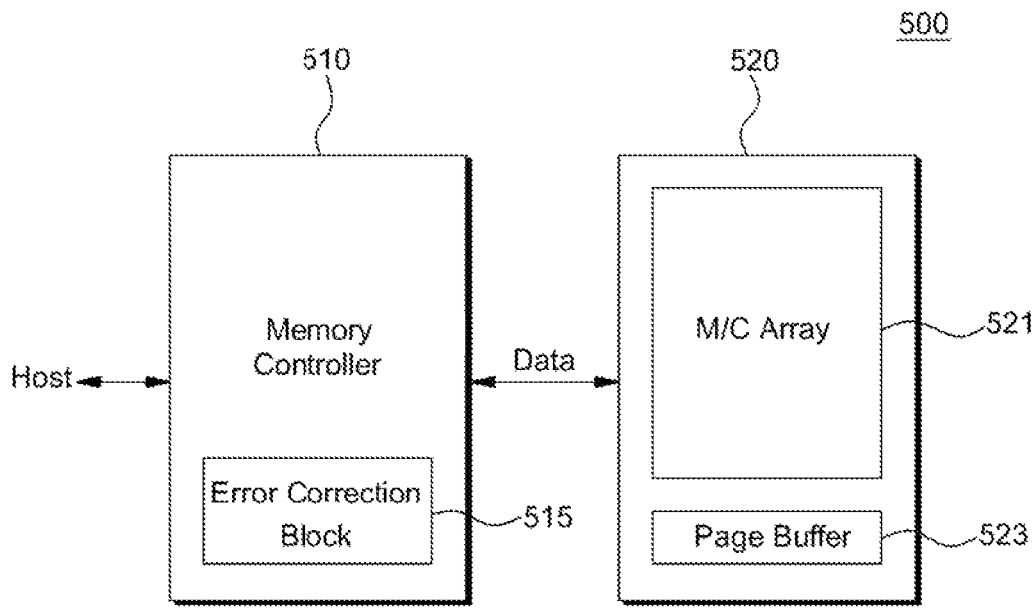
FIG. 6 is a block diagram showing a memory system in accordance with an embodiment of the present disclosure.

FIG. 6 is a block diagram showing a memory system 500 in accordance with an embodiment of the present disclosure.

Referring to FIG. 6, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from an external circuit.

The memory controller 510 may perform an error correcting encoding process on a data requested to write, when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on a data output from the non-volatile memory device 520. Errors included in output data may be corrected by the error correcting decoding process. To detect and correct the errors, the memory controller 510 may include an error correction block 515.

The non-volatile memory device 520 may include a memory cell array 521 and a page buffer 523. The memory cell array 521 may include an array of single-level memory cells or 2 or higher bit multi-level memory cells. When the memory controller 510 receives an initialization request, the memory controller 510 may initialize string selection transistors of respective memory layers to have a predetermined state (threshold voltage) by using a programming technique or an erasing technique using time varying erase voltage signals.

Figure 7:
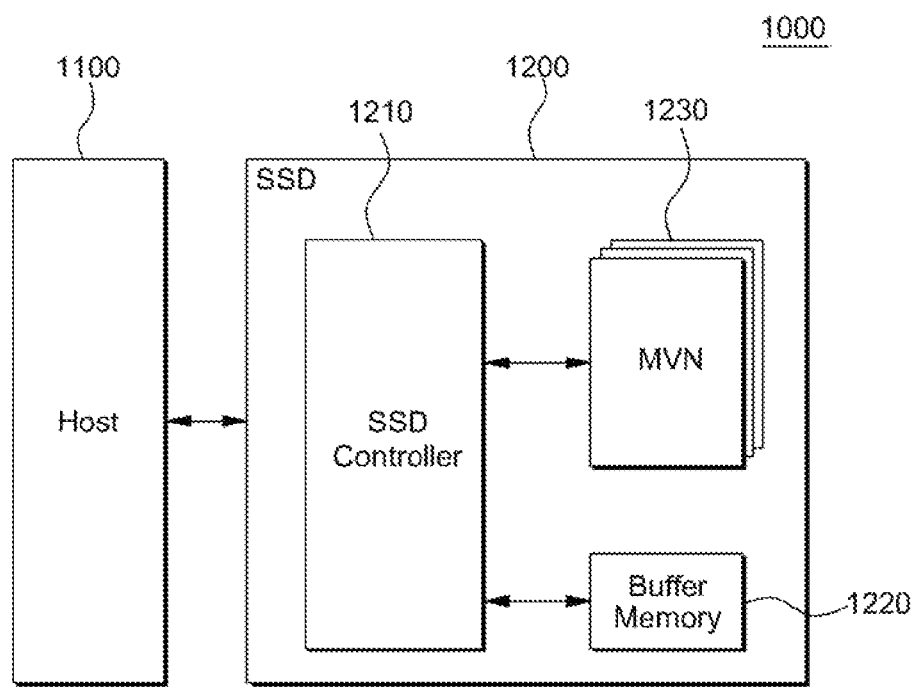
FIG. 7 is a block diagram showing a storage device including a solid state disk (SSD), in accordance with an embodiment of the present disclosure.

FIG. 7 is a block diagram showing a storage device 1000 including a SSD in accordance with an embodiment of present disclosure.

Referring to FIG. 7, the storage device 1000 includes a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. In an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Unlimited examples of the bus format of the host 1100 may include USB (Universal Serial Bus), SCSI (Small Computer System Interface), PCI express, ATA (Advanced Technology Attachment), PATA (Parallel ATA), SATA (Serial ATA), and SAS (Serial Attached SCSI).

A data to be written provided by the host 1100 or a data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration due to the speed difference. The buffer memory 1220 therefor may be a synchronous DRAM for providing sufficient buffering performance. However, the present invention is not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferro-dielectric memory, or a memory system including a combination thereof may be applied as the non-volatile memory device 1230.

Figure 8:
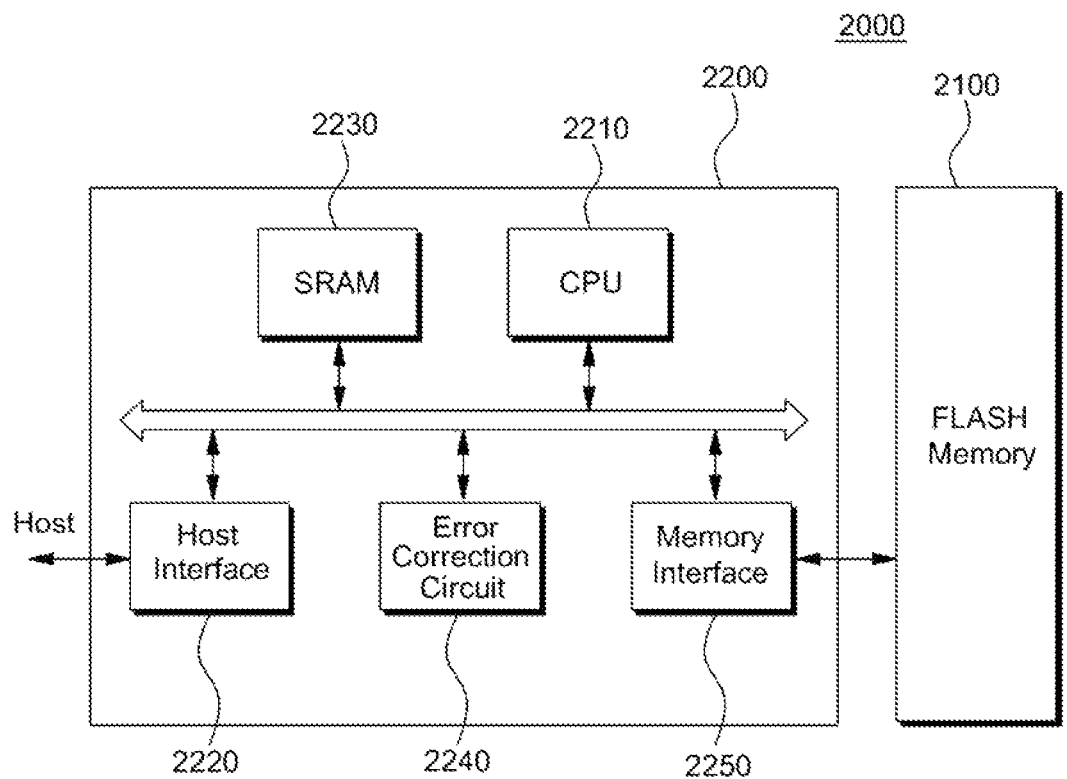
FIG. 8 is a block diagram showing a memory system in accordance with an embodiment of the present disclosure.

FIG. 8 is a block diagram showing a memory system 2000 in accordance with another embodiment of the present disclosure.

Referring to FIG. 8, the memory system 2000 may include a memory controller 2200 and a flash memory device 2100. The flash memory device 2100 may include the non-volatile memory devices 100, 200, and 300 as described above with reference to FIGS. 1 through 7. The flash memory device 2100 may detect memory cells with abnormal speeds during verification of target states, and thus the flash memory device 2100 may show reliable program performance.

The memory controller 2200 may be configured to control the flash memory device 2100. An SRAM 2230 may be used as an operation memory for the CPU 2210. A host interface 2220 may embody a data exchange protocol for the host to be connected to the memory system 2000. An error correction circuit 2240 equipped in the memory controller 2200 may detect and correct errors included in data read out from the flash memory device 2100. A memory interface 2250 may perform interfacing with the flash memory device 2100. A CPU 2210 may perform overall control operations for data exchange of the memory controller 2200. The memory system 2000 in accordance with the present invention may further include a ROM (not shown) that stores code data for interfacing with a host.

The flash memory device 2100 may be configured to communicate with an external circuit (e.g., a host) via one of various interface protocols, such as USB, MMC, PCI-E, SAS, SATA, PATA, SCSI, ESDI, or IDE. The memory system 2000 in accordance with the present invention may be applied to various user devices, such as a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 9:
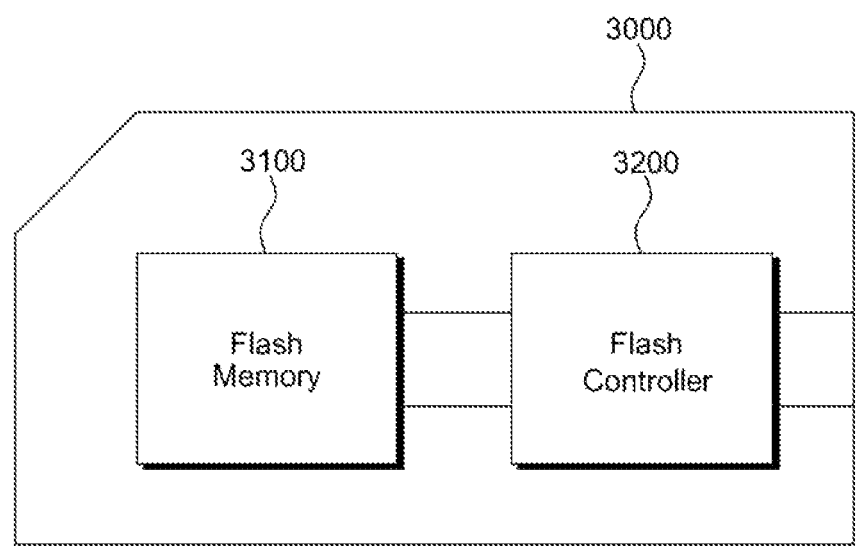
FIG. 9 is a block diagram showing a data storage device in accordance with an embodiment of the present disclosure.

FIG. 9 is a block diagram showing a data storage device 3000 in accordance with another embodiment of the present disclosure.

Referring to FIG. 9, the data storage device 3000 may include a flash memory 3100 and a flash controller 3200. The flash controller 3200 may control the flash memory 3100 based on control signals received from an external circuit connected to the data storage device 3000. A 3D memory array structure of the flash memory 3100 may be a channel stacked structure, a straight-shaped bit cost scalable structure, or a pipe-shaped BiCs structure. However, the above-stated structures are merely examples, and the present invention is not limited thereto.

The data storage device 3000 in accordance with the present invention may constitute a memory card device, a SSD device, a multimedia card device, a SD card, a memory stick device, a hard disk drive device, a hybrid drive device, or a USB flash device. For example, the data storage device 3000 in accordance with the present invention may be a memory card that satisfies a standard or a specification to be generally used in an electronic device, such as a digital camera or a personal computer.

Figure 10:
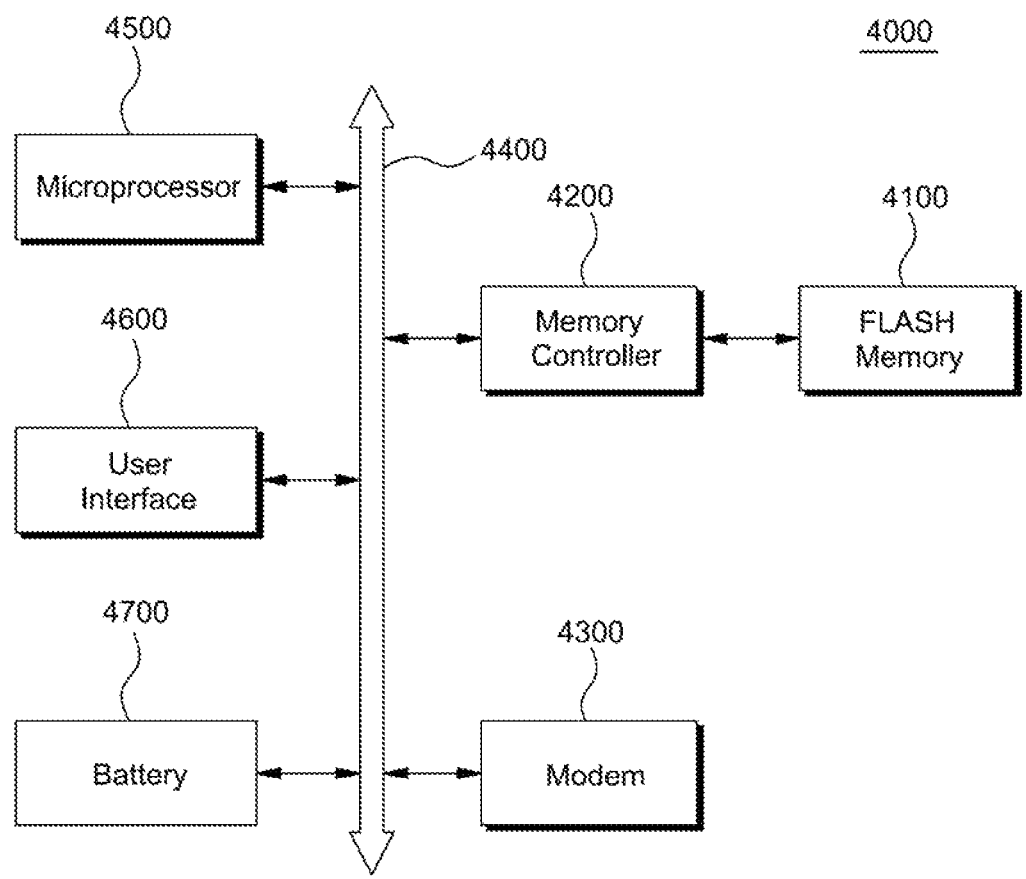
FIG. 10 is a block diagram showing a flash memory device and a computing system including the same, in accordance with an embodiment of the present disclosure.

FIG. 10 is a block diagram showing a flash memory device 4100 and a computing system 4000 including the flash memory device 4100 in accordance with an embodiment of the present disclosure.

Referring to FIG. 10, the computing system 4000 in accordance with the present disclosure may include the flash memory device 4100, a memory controller 4200, a modem 4300, such as a baseband chipset, a microprocessor 4500, and a user interface 4600 that are electrically connected to a bus 4400.

The flash memory device 4100 shown in FIG. 10 may be a non-volatile memory device as described above. The computing system 4000 in accordance with the present invention may be a mobile device. In this case, the computing system 4000 may further include a battery 4700 for supplying a power for operating the computing system 4000. Although not shown, the computing system 4000 in accordance with the present invention may further include an application chipset, a camera image processor (CIS), or a mobile DRAM. The memory controller 4200 and the flash memory device 4100 may constitute a SSD using a non-volatile memory device for storing data.

A non-volatile memory device and/or a memory controller in accordance with the present invention may be mounted via various types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

In accordance with an embodiment of the present disclosure, a method of initializing a 3D non-volatile memory device to set string selection transistors to have predetermined threshold values may be provided within the minimum timing sequence and without a complicated peripheral circuit by programming string selection transistors of memory layer, applying a time varying erase voltage signal to a selected memory layer, and controlling each of string selection lines in a time varying section of the time varying erase voltage signal to control erase degrees of programmed string selection transistors.

Furthermore, in accordance with another embodiment of the present invention, a method of reliably programming a 3D non-volatile memory device for programming selected memory cell without a disturbance between the selected memory cell and unselected memory cells by using initialized string selection transistors may be provided.

While embodiments of the present disclosure has been particularly shown and described, it will be understood by those of ordinary skill in the art that various changes in form and details may be made therein without departing from the spirit and scope of the present disclosure as defined by the following claims.

What is claimed is:

1. A method of initializing a three-dimensional (3D) non-volatile memory device, the 3D non-volatile memory device comprising a plurality of string selection lines, a plurality of wordlines, a ground selection line, and a plurality of memory layers, each of the memory layers comprising a plurality of channel lines respectively coupled to a plurality of bitlines via first ends of the plurality of channel lines and coupled to a common source line via second ends of the plurality of channel lines, wherein the plurality of string selection lines, the plurality of wordlines, and the ground selection line intersect with the plurality of channel lines, and each of the plurality of channel lines defines a memory string and the memory string has string selection transistors respectively coupled with the plurality of string selection lines, the method comprising:
  initially leveling threshold voltages of the string selection transistors disposed in one or more of the plurality of memory layers to have a predetermined target level;

applying a first time varying erase voltage signal having a first time varying section to a first plurality of channel lines of a first memory layer selected among the plurality of memory layers, the initially leveled string selection transistors including a first plurality of string selection transistors in the first memory layer; and setting threshold voltages of the first plurality of string selection transistors in the first memory layer by controlling each of the plurality of string selection lines coupled with the first plurality of string selection transistors during a first time interval corresponding to the first time varying section of the first time varying erase voltage signal.

2. The method of claim 1, further comprising:

selecting a second memory layer among the plurality of memory layers comprising the initially leveled string selection transistors, and applying a second time varying erase voltage signal having a second time varying section to a second plurality of channel lines of the second selected memory layer; and setting respective threshold voltages of a second plurality of string selection transistors in the second memory layer by controlling the plurality of string selection lines respectively coupled with corresponding ones of the second plurality of string selection transistors during a second time interval corresponding to the second time varying section of the second time varying erase voltage signal.

3. The method of claim 1, wherein the predetermined target level includes a plurality of target levels respectively corresponding to the plurality of memory layers, the plurality of target levels being different from one another.

4. The method of claim 1, wherein the first time varying section of the first time varying erase voltage signal is a single time varying section.

5. The method of claim 1, wherein the first time varying section of the first time varying erase voltage signal comprises a ramping section, a step-like section, or a combination thereof.

6. The method of claim 1, wherein the first time varying section comprises an increasing ramp section or a decreasing ramp section.

7. The method of claim 1, wherein the first time varying erase voltage signal is applied to a first common source line coupled to the selected first memory layer, the method further comprising:

applying a voltage signal for erase inhibition to one or more of common source lines other than the first common source line, the one or more common source lines being coupled to one or more of unselected memory layers among the plurality of memory layers when the first time varying erase voltage signal is applied and the threshold voltages of the first plurality of string selection transistors in the first memory layer are set.

8. The method of claim 7, wherein the voltage signal for erase inhibition has a positive voltage level that is smaller than a maximum level of the first time varying erase voltage signal.

9. The method of claim 1, further comprising causing the plurality of bitlines to float when the first time varying erase voltage signal is applied and the threshold voltages of the first plurality of string selection transistors in the first memory layer are set.

10. The method of claim 1, further comprising causing the plurality of wordlines to float when the first time varying erase voltage signal is applied and the threshold voltages of the first plurality of string selection transistors in the first memory layer are set.

11. The method of claim 1, wherein, when the first time varying section of the first time varying erase voltage signal has an increasing ramp section, controlling each of the plurality of string selection lines includes causing each of the string selection lines that were in a ground state to float at a plurality of time points within the first time interval corresponding to the first time varying section to terminate erase operations for the first plurality of string selection transistors at the plurality of time points, respectively.

12. The method of claim 1, wherein, when the first time varying section of the time varying erase voltage signal has a decreasing ramp section, controlling each of the plurality of string selection lines includes grounding each of the plurality of string selection lines that were in a floated state at a plurality of time points within the first time interval corresponding to the first time varying section to start erase operations for the first plurality of string selection transistors at the plurality of time points, respectively.

13. The method of claim 1, wherein the channel lines of the 3D non-volatile memory device have a channel stacked structure, a straight-shaped bit cost scalable (BiCs) structure, a pipe-shaped BiCs structure, or a combination thereof.

14. The method of claim 1, wherein the 3D non-volatile memory device is a NAND flash memory device.

15. A method of driving a 3D non-volatile memory device, the 3D non-volatile memory device comprising a plurality of string selection lines, a plurality of wordlines, a ground selection line, and a plurality of memory layers, each of the memory layers comprising a plurality of channel lines respectively coupled to bitlines via first ends of the plurality of channel lines and coupled to a common source line via second ends of the plurality of channel lines, wherein the plurality of string selection lines, the plurality of wordlines, and the ground selection line intersect with the plurality of channel lines, and each of the plurality of channel lines defines a memory string and the memory string has string selection transistors respectively coupled with the plurality of string selection lines, the method comprising:

initially leveling threshold voltages of string selection transistors disposed in one or more of the plurality of memory layers to have a predetermined target level;

applying a first time varying erase voltage signal having a first time varying section to a first plurality of channel lines of a first memory layer, the first memory layer being one of the plurality of memory layers, the initially leveled string selection transistors including a first plurality of string selection transistors in the first memory layer;

setting threshold voltages of the first plurality of string selection transistors in the first memory layer by controlling each of the plurality of string selection lines coupled with the first plurality of string selection transistors during a first time interval corresponding to the first time varying section of the first time varying erase voltage signal;

selecting a second memory layer, the second memory layer being one of the plurality of memory layers; and programming a selected memory cell of a selected memory string among a plurality of memory strings of the selected second memory layer by applying a bitline program voltage to a bitline coupled to the selected memory string, applying a program inhibition voltage higher than the bitline program voltage to bitlines coupled to unselected memory strings, and applying a program voltage to a wordline coupled to the selected memory cell.

16. The method of claim 15, wherein the bitline program voltage is a ground voltage.

17. The method of claim 15, wherein the program inhibition voltage is a common collector voltage.

18. The method of claim 15, wherein a common collector voltage is applied to common source lines of unselected memory layers among the plurality of memory layers.

19. The method of claim 15, wherein the plurality of channel lines of the 3D non-volatile memory device have a channel stacked structure, a straight-shaped bit cost scalable (BiCs) structure, a pipe-shaped BiCs structure, or a combination thereof.

20. The method of claim 15, wherein the 3D non-volatile memory device is a NAND flash memory device.

* * * * *